United States Patent
Jeon et al.

(10) Patent No.: US 12,262,534 B2
(45) Date of Patent: Mar. 25, 2025

(54) SEMICONDUCTOR DEVICES AND ELECTRONIC SYSTEMS INCLUDING THE SAME

(71) Applicant: Samsung Electronics Co., Ltd., Suwon-si (KR)

(72) Inventors: Wooyong Jeon, Anyang-si (KR); Moorym Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 475 days.

(21) Appl. No.: 17/667,156

(22) Filed: Feb. 8, 2022

(65) Prior Publication Data
US 2022/0344361 A1    Oct. 27, 2022

(30) Foreign Application Priority Data

Apr. 27, 2021    (KR) .................. 10-2021-0054393

(51) Int. Cl.
| | | |
|---|---|---|
| *H10B 41/40* | (2023.01) | |
| *H01L 23/48* | (2006.01) | |
| *H10B 41/10* | (2023.01) | |
| *H10B 41/27* | (2023.01) | |
| *H10B 41/35* | (2023.01) | |
| *H10B 43/10* | (2023.01) | |
| *H10B 43/27* | (2023.01) | |
| *H10B 43/35* | (2023.01) | |
| *H10B 43/40* | (2023.01) | |

(52) U.S. Cl.
CPC ........... *H10B 41/40* (2023.02); *H01L 23/481* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H10B 43/40* (2023.02)

(58) Field of Classification Search
None
See application file for complete search history.

(56) References Cited

U.S. PATENT DOCUMENTS

| | | |
|---|---|---|
| 8,971,118 B2 | 3/2015 | Jin et al. |
| 9,991,282 B1 | 6/2018 | Shimizu et al. |

(Continued)

FOREIGN PATENT DOCUMENTS

| | | |
|---|---|---|
| KR | 20170086347 A | 7/2017 |
| KR | 20170131945 A | 12/2017 |

(Continued)

*Primary Examiner* — Scott B Geyer
(74) *Attorney, Agent, or Firm* — Myers Bigel, P.A.

(57) ABSTRACT

Disclosed are a semiconductor device and an electronic system including the same. The semiconductor device may include a peripheral circuit structure including peripheral circuits that are on a semiconductor substrate, and first bonding pads that are electrically connected to the peripheral circuits, and a cell array structure including a memory cell array including memory cells that are three-dimensionally arranged on a semiconductor layer, and second bonding pads that are electrically connected to the memory cell array and are coupled to the first bonding pads. The cell array structure may include a resistor pattern positioned at the same level as the semiconductor layer, a stack including insulating layers and electrodes that are vertically and alternately stacked on the semiconductor layer, and vertical structures penetrating the stack.

20 Claims, 19 Drawing Sheets

(56) References Cited

U.S. PATENT DOCUMENTS

| | | | |
|---|---|---|---|
| 2006/0022276 A1* | 2/2006 | Park | H10B 69/00 |
| | | | 257/E21.691 |
| 2006/0138559 A1* | 6/2006 | Lee | H10B 41/40 |
| | | | 257/536 |
| 2014/0166963 A1 | 6/2014 | Lee | |
| 2017/0207226 A1 | 7/2017 | Lee | |
| 2017/0338241 A1 | 11/2017 | Lee | |
| 2018/0254247 A1 | 9/2018 | Kim et al. | |
| 2019/0074282 A1 | 3/2019 | Shin et al. | |
| 2019/0115362 A1 | 4/2019 | Choi | |
| 2021/0327837 A1* | 10/2021 | Yoon | H01L 23/5228 |

FOREIGN PATENT DOCUMENTS

| | | |
|---|---|---|
| KR | 20180101053 A | 9/2018 |
| KR | 20190025795 A | 3/2019 |
| KR | 20190041287 A | 4/2019 |
| KR | 102027133 B1 | 10/2019 |

\* cited by examiner

SEMICONDUCTOR DEVICES AND ELECTRONIC SYSTEMS INCLUDING THE SAME

CROSS-REFERENCE TO RELATED APPLICATION(S)

This U.S. non-provisional patent application claims priority under 35 U.S.C. § 119 to Korean Patent Application No. 10-2021-0054393, filed on Apr. 27, 2021, in the Korean Intellectual Property Office, the entire contents of which are hereby incorporated by reference.

BACKGROUND

The present disclosure relates to semiconductor devices and electronic systems including the same. A semiconductor device capable of storing a large amount of data may be required as a part of an electronic system. Accordingly, many studies are being conducted to increase the data storage capacity of semiconductor devices. For example, semiconductor devices in which memory cells are three-dimensionally arranged are being suggested.

SUMMARY

An embodiment of the inventive concept provides a semiconductor device with improved reliability and an increased integration density.

An embodiment of the inventive concept provides an electronic system including a semiconductor device.

According to an embodiment of the inventive concept, a semiconductor device may include a peripheral circuit structure including peripheral circuits that are on a semiconductor substrate, and first bonding pads that are electrically connected to the peripheral circuits, and a cell array structure including a memory cell array including memory cells that are three-dimensionally arranged on a semiconductor layer, and second bonding pads that are electrically connected to the memory cell array and are coupled to the first bonding pads. The cell array structure may include a resistor pattern positioned at the same level as the semiconductor layer, a stack including insulating layers and electrodes that are vertically and alternately stacked on the semiconductor layer, and vertical structures penetrating the stack.

According to an embodiment of the inventive concept, a semiconductor device may include a peripheral circuit structure including peripheral circuits on a semiconductor substrate and peripheral circuit interconnection lines electrically connected to the peripheral circuits, a semiconductor layer on the peripheral circuit structure, a resistor pattern that is on the peripheral circuit structure and is horizontally spaced apart from the semiconductor layer, a stack including insulating layers and electrodes that are vertically and alternately stacked on the semiconductor layer, and a source structure between the semiconductor layer and the stack. The source structure may include a source semiconductor pattern and a support semiconductor pattern that are sequentially stacked on the semiconductor layer. The resistor pattern may include the same material as the semiconductor layer. A level of a surface of the resistor pattern that is closest to the peripheral circuit structure may be equal to that of a surface of the semiconductor layer that faces the source semiconductor pattern, or the level of the surface of the resistor pattern may be farther than the surface of the semiconductor layer from the support semiconductor pattern.

According to an embodiment of the inventive concept, an electronic system may include a semiconductor device including a peripheral circuit structure including peripheral circuits on a semiconductor substrate and peripheral circuit interconnection lines electrically connected to the peripheral circuits, a cell array structure on the peripheral circuit structure, and an input/output pad electrically connected to the peripheral circuits, and a controller that is electrically connected to the semiconductor device through the input/output pad and may be configured to control the semiconductor device. The cell array structure may include a semiconductor layer, a resistor pattern that is on the peripheral circuit structure and is horizontally spaced apart from the semiconductor layer, and a stack including insulating layers and electrodes that are vertically and alternately stacked on the semiconductor layer. The resistor pattern may include the same material as the semiconductor layer and may have a thickness that is smaller than or equal to that of the semiconductor layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Example embodiments of the inventive concepts will now be described more fully with reference to the accompanying drawings, in which example embodiments are shown.

Figure 1:
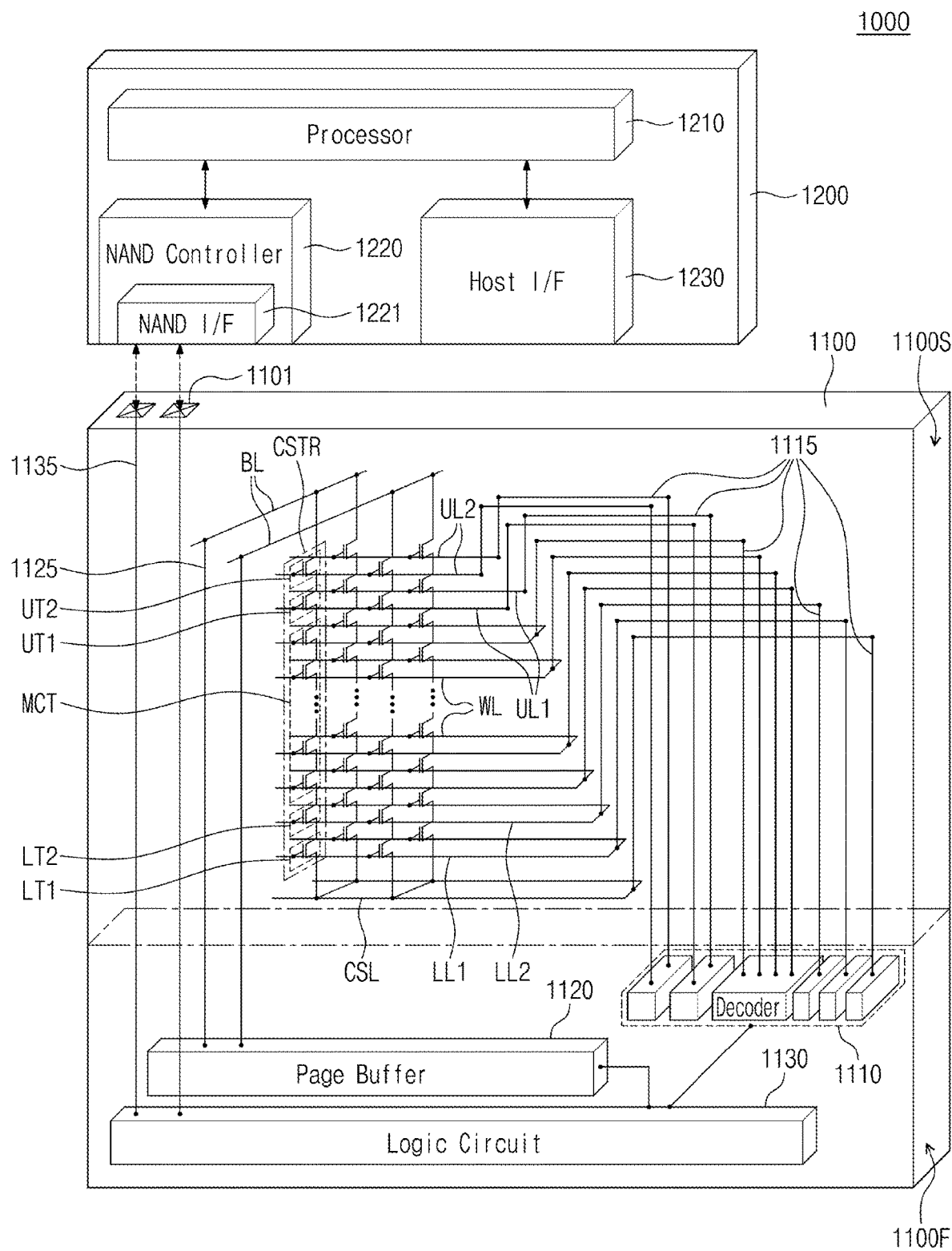
FIG. 1 is a diagram schematically illustrating an electronic system including a semiconductor device according to an embodiment of the inventive concept.

FIG. 1 is a diagram schematically illustrating an electronic system including a semiconductor device according to an embodiment of the inventive concept.

Referring to FIG. 1, an electronic system 1000 according to an embodiment of the inventive concept may include a semiconductor device 1100 and a controller 1200, which are electrically connected to each other. The electronic system 1000 may be a storage device including one or more semiconductor devices 1100 or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. In an embodiment, the first structure 1100F may be disposed beside the second structure 1100S. The first structure 1100F may be a peripheral circuit structure, which includes a decoder circuit 1110, a page buffer 1120, and a logic circuit 1130. The second structure 1100S may include a memory cell structure, which includes a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to embodiments.

In an embodiment, the upper transistors UT1 and UT2 may include at least one string selection transistor, and the lower transistors LT1 and LT2 may include at least one ground selection transistor. The gate lower lines LL1 and LL2 may be respectively used as gate electrodes of the lower transistors LT1 and LT2. The word lines WL may be respectively used as gate electrodes of the memory cell transistors MCT, and the gate upper lines UL1 and UL2 may be respectively used as gate electrodes of the upper transistors UT1 and UT2.

In an embodiment, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used to perform an erase operation, in which a gate-induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F into the second structure 1100S. The bit lines BL may be electrically connected to the page buffer 1120 through second connection lines 1125, which are extended from the first structure 1100F into the second structure 1100S.

In the first structure 1100F, the decoder circuit 1110 and the page buffer 1120 may be configured to control a control operation, which is performed on at least one of the memory cell transistors MCT by a selection memory cell transistor. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is provided in the first structure 1100F and is extended into the second structure 1100S.

The controller 1200 may include a processor 1210, a NAND controller 1220, and a host interface (I/F) 1230. In an embodiment, the electronic system 1000 may include a plurality of semiconductor devices 1100, and in this case, the controller 1200 may control the semiconductor devices 1100.

The processor 1210 may control overall operations of the electronic system 1000 including the controller 1200. The processor 1210 may be operated based on a specific firmware and may control the NAND controller 1220 to access the semiconductor device 1100. The NAND controller 1220 may include a NAND interface 1221, which is used to communicate with the semiconductor device 1100. The NAND interface 1221 may be used to transmit and receive control commands to control the semiconductor device 1100, data to be written in or read from the memory cell transistors MCT of the semiconductor device 1100, and so forth. The host interface 1230 may be configured to allow for communication between the electronic system 1000 and an external host. When a control command is received from an external host through the host interface 1230, the processor 1210 may control the semiconductor device 1100 in response to the control command.

Figure 2:
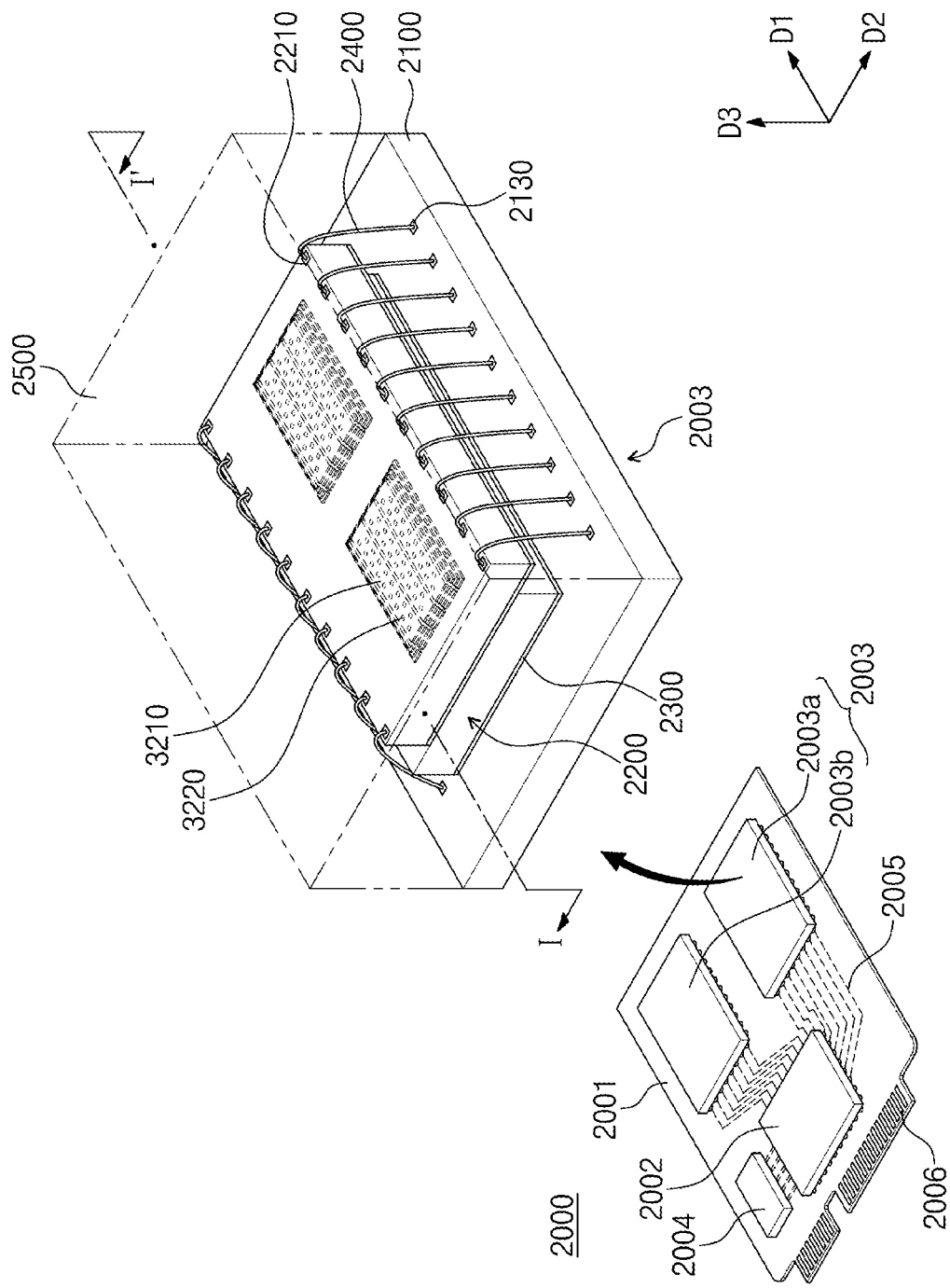
FIG. 2 is a perspective view schematically illustrating an electronic system including a semiconductor device according to an embodiment of the inventive concept.

FIG. 2 is a perspective view schematically illustrating an electronic system including a semiconductor device according to an embodiment of the inventive concept.

Referring to FIG. 2, an electronic system 2000 according to an embodiment of the inventive concept may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 and to each other by interconnection patterns 2005, which are formed in the main substrate 2001.

The main substrate 2001 may include a connector 2006, which includes a plurality of pins coupled to an external host. In the connector 2006, the number and arrangement of the pins may depend on a communication interface between the electronic system 2000 and the external host. In an embodiment, the electronic system 2000 may communicate with the external host, in accordance with one of interfaces, such as universal serial bus (USB), peripheral component interconnect express (PCI-Express), serial advanced technology attachment (SATA), universal flash storage (UFS) M-Phy, or the like. In an embodiment, the electronic system 2000 may be driven by a power, which is supplied from the external host through the connector 2006. The electronic system 2000 may further include a Power Management Integrated Circuit (PMIC) distributing a power, which is supplied from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory, which relieves technical difficulties caused by a difference in speed between the semiconductor package 2003, which serves as a data storage device, and an external host. In an embodiment, the DRAM 2004 in the electronic system 2000 may serve as a cache memory and may provide a storage space to temporarily store data during a control operation on the semiconductor package 2003. In the case where the electronic system 2000 includes the DRAM 2004, the controller 2002 may further include a DRAM controller to control the DRAM 2004, in addition to a NAND controller to control the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 disposed on respective bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include stacks 3210 and vertical structures 3220. Each of the semiconductor chips 2200 may include a semiconductor device, which will be described below, according to an embodiment of the inventive concept.

In an embodiment, the connection structure 2400 may be a bonding wire electrically connecting the input/output pad 2210 to the package upper pads 2130. Thus, in each of the first and second semiconductor packages 2003a and 2003b, the semiconductor chips 2200 may be electrically connected to each other in a bonding wire manner and may be electrically connected to the package upper pads 2130 of the package substrate 2100. In other embodiments, the semiconductor chips 2200 in each of the first and second semiconductor packages 2003a and 2003b may be electrically connected to each other by a connection structure including through silicon vias (TSVs), not by the connection structure 2400 provided in the form of bonding wires.

In an embodiment, the controller 2002 and the semiconductor chips 2200 may be included in a single package. In an embodiment, the controller 2002 and the semiconductor chips 2200 may be mounted on a separate interposer substrate, which is prepared regardless of the main substrate 2001, and may be connected to each other through interconnection lines, which are provided in the interposer substrate.

Figure 3:
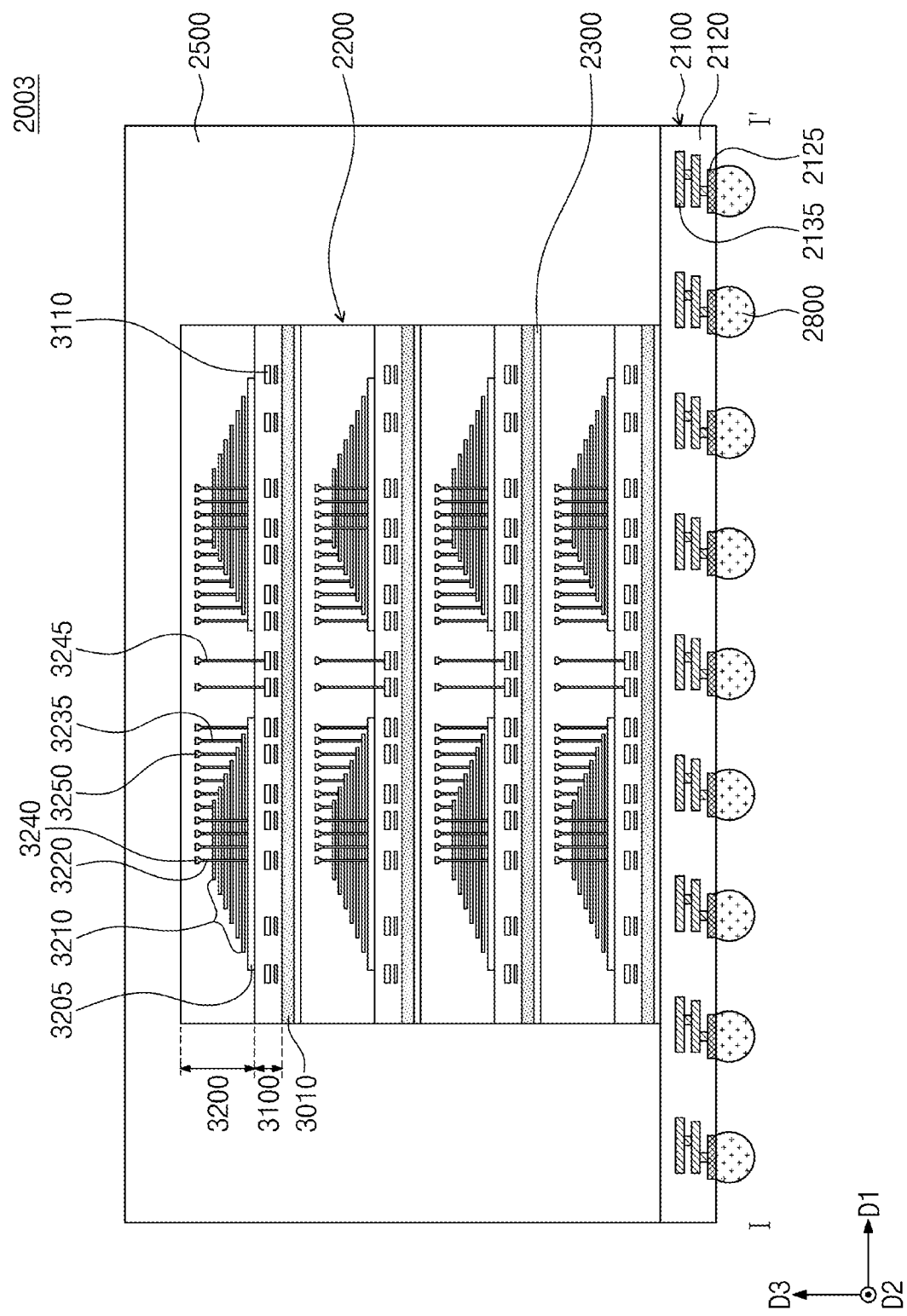
FIGS. 3 and 4 are sectional views schematically illustrating semiconductor packages according to an embodiment of the inventive concept.
Figure 4:
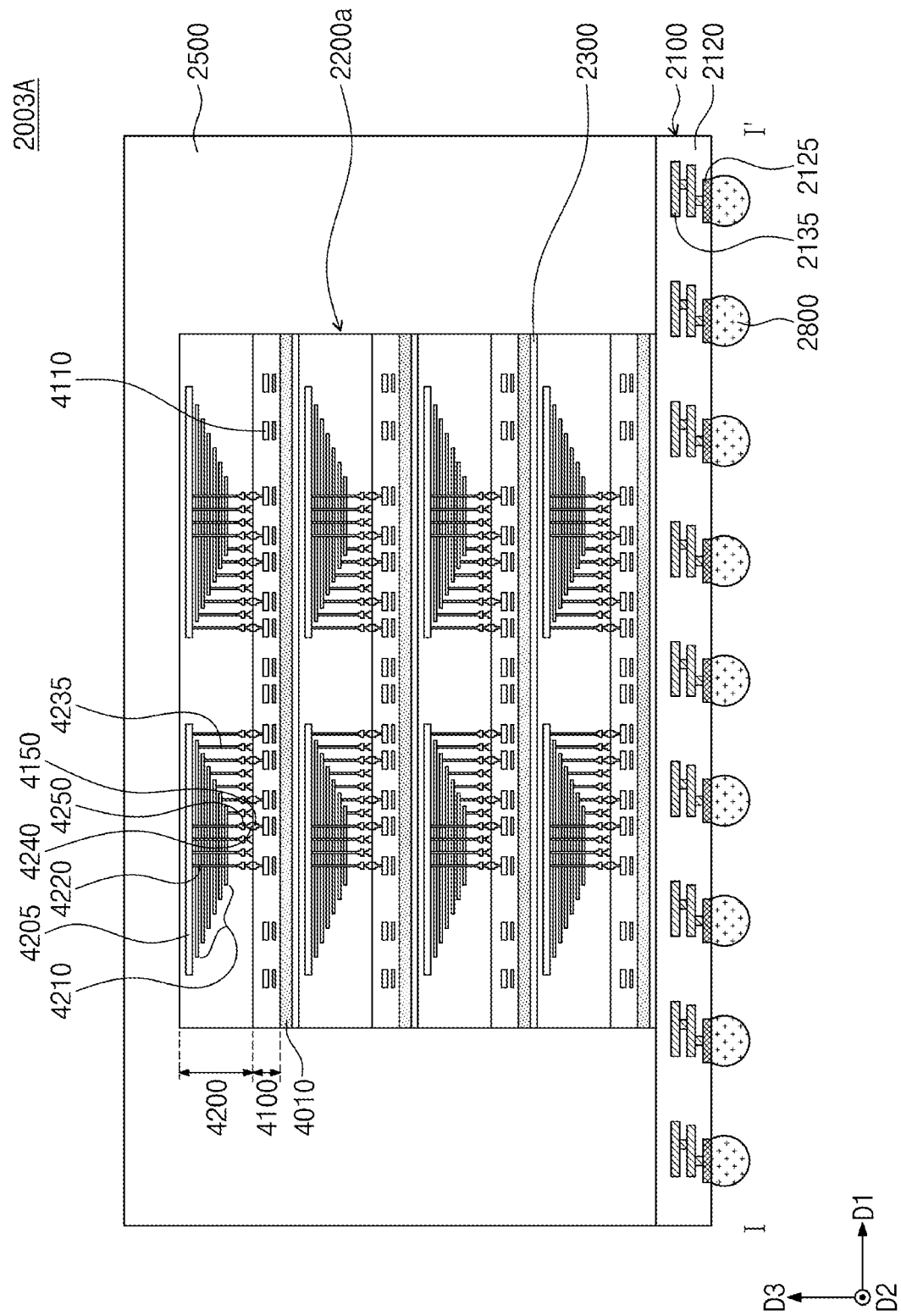

FIGS. 3 and 4 are sectional views schematically illustrating semiconductor packages according to an embodiment of the inventive concept. FIGS. 3 and 4 are sectional views of the semiconductor package of FIG. 2 taken along a line I-I' of FIG. 2, and illustrate two different examples of the semiconductor package of FIG. 2.

Referring to FIG. 3, in the semiconductor package 2003, the package substrate 2100 may be a printed circuit board. The package substrate 2100 may include a package substrate body portion 2120, the package upper pads 2130 (e.g., of FIG. 2), which are disposed on a top surface of the package substrate body portion 2120, lower pads 2125, which are disposed on or exposed through a bottom surface of the package substrate body portion 2120, and internal lines 2135, which are provided in the package substrate body portion 2120 to electrically connect the package upper pads 2130 to the lower pads 2125. The package upper pads 2130 may be electrically connected to the connection structures 2400 (FIG. 2). The lower pads 2125 may be connected to the interconnection patterns 2005 (FIG. 2), which are provided in the main substrate 2001 of the electronic system 2000, through conductive connecting portions 2800, as shown in FIGS. 2 and 3.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, the stack 3210 on the source structure 3205, the vertical structures 3220 and separation structures penetrating the stack 3210, bit lines 3240 electrically connected to the vertical structures 3220, and cell contact plugs 3235 electrically connected to the word lines WL (e.g., of FIG. 1) of the stack 3210. Each of the first and second structures 3100 and 3200 and the semiconductor chips 2200 may further include a metal structure to be described below.

Each of the semiconductor chips 2200 may include penetration lines 3245, which are electrically connected to the peripheral lines 3110 of the first structure 3100 and are extended into the second structure 3200. The penetration line 3245 may be disposed outside the stack 3210, and in an embodiment, the penetration line 3245 may be provided to further penetrate the stack 3210. Each of the semiconductor chips 2200 may further include the input/output pad 2210 (e.g., see FIG. 2), which are electrically connected to the peripheral lines 3110 of the first structure 3100.

Referring to FIG. 4, in the semiconductor package 2003A, each of the semiconductor chips 2200a may include a semiconductor substrate 4010, a first structure 4100 on the semiconductor substrate 4010, and a second structure 4200, which is provided on the first structure 4100 and is bonded to the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the source structure 4205 and the first structure 4100, vertical structures 4220 and a separation structure penetrating the stack 4210, and second junction structures 4250, which are respectively and electrically connected to the vertical structures 4220 and the word lines WL (e.g., of FIG. 1) of the stack 4210. For example, the second junction structures 4250 may be electrically and respectively connected to the vertical structures 4220 and the word lines WL (e.g., of FIG. 1) through bit lines 4240, which are electrically connected to the vertical structures 4220, and cell contact plugs 4235, which are electrically connected to the word lines WL (e.g., of FIG. 1). The first junction structures 4150 of the first structure 4100 may be in contact with and coupled to the second junction structures 4250 of the second structure 4200. The coupled portions of the first junction structures 4150 and the second junction structures 4250 may be formed of or include, for example, copper (Cu).

Each of the first and second structures 4100 and 4200 and the semiconductor chips 2200a may further include a metal structure, as will be described below with reference to an embodiment. Each of the semiconductor chips 2200a may further include the input/output pads 2210 (e.g., of FIG. 2), which are electrically connected to the peripheral lines 4110 of the first structure 4100.

The semiconductor chips 2200 or 2200a of FIG. 3 or 4 may be electrically connected to each other by the connection structures 2400 (FIG. 2), which are provided in the form of bonding wires. However, in an embodiment, semiconductor chips, which are provided in the same semiconductor package as the semiconductor chips 2200 or 2200a of FIG. 3 or 4, may be electrically connected to each other by a connection structure including through silicon vias (TSVs).

The first structure 3100 or 4100 of FIG. 3 or 4 may correspond to a peripheral circuit structure in an embodiment to be described below, and the second and second structure 3200 or 4200 of FIG. 3 or 4 may correspond to a cell array structure in an embodiment to be described below.

Figure 5:
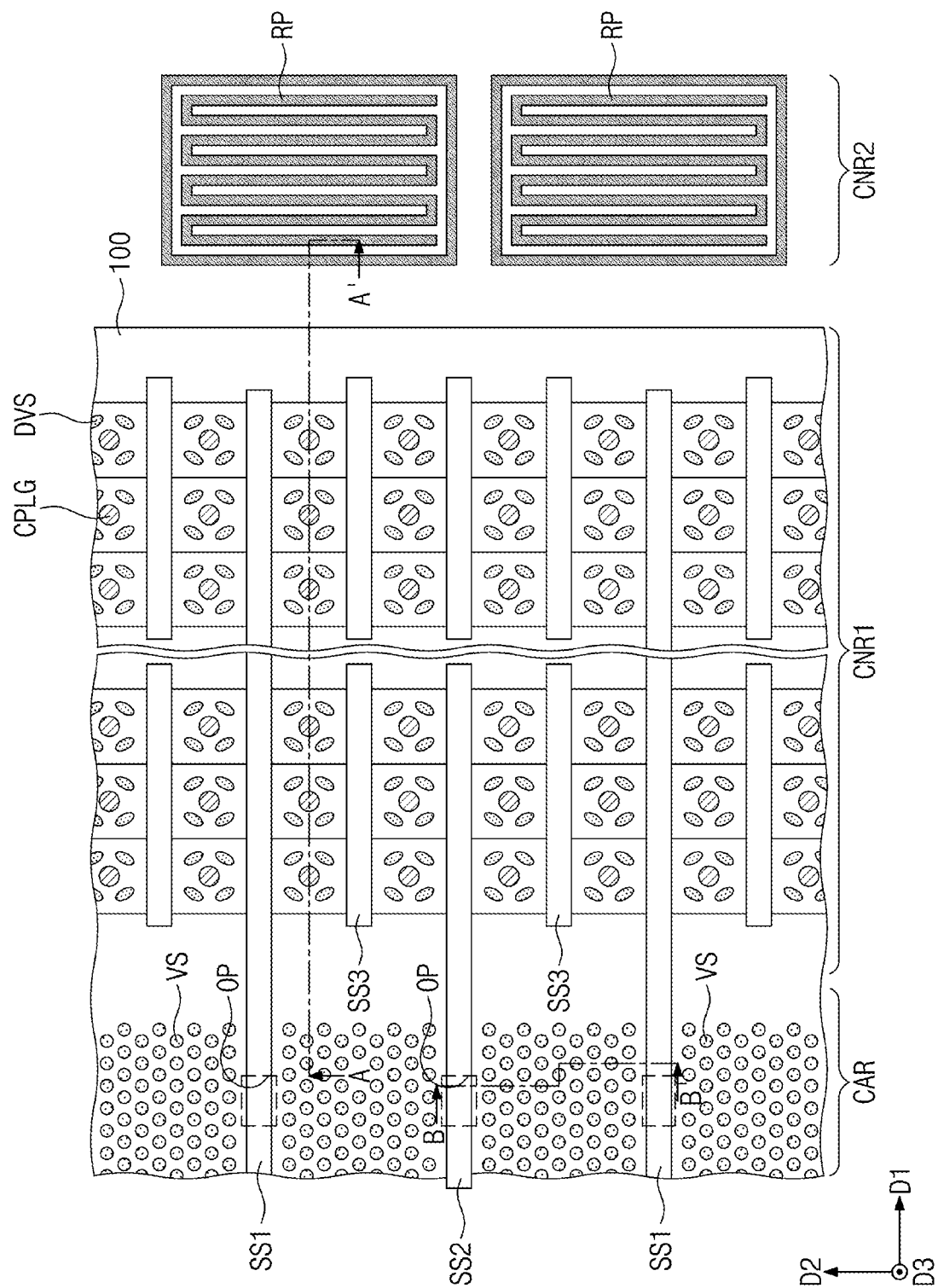
FIG. 5 is a plan view illustrating a cell array structure of a semiconductor device according to an embodiment of the inventive concept.
Figure 6A:
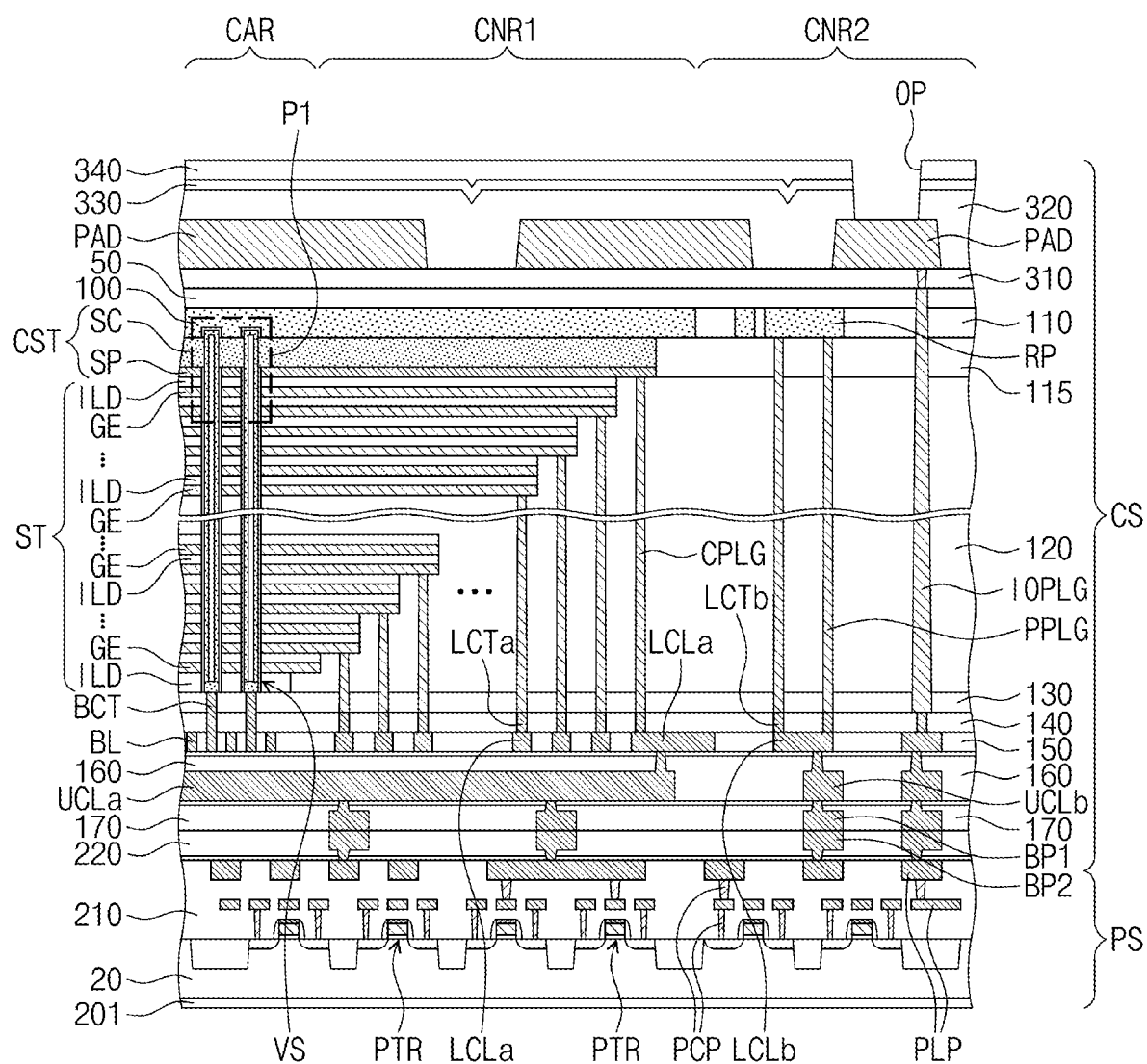
FIGS. 6A and 6B are sectional views, which are respectively taken along lines A-A' and B-B' of FIG. 5 to illustrate a three-dimensional semiconductor memory device according to an embodiment of the inventive concept.
Figure 6B:
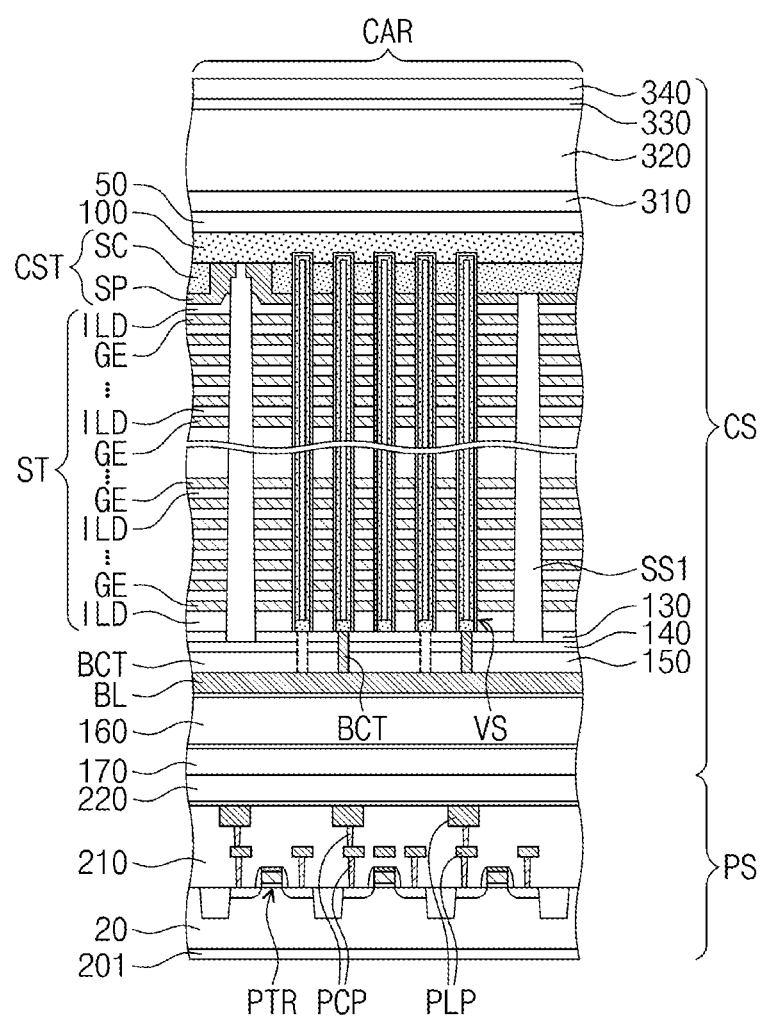
Figure 7:
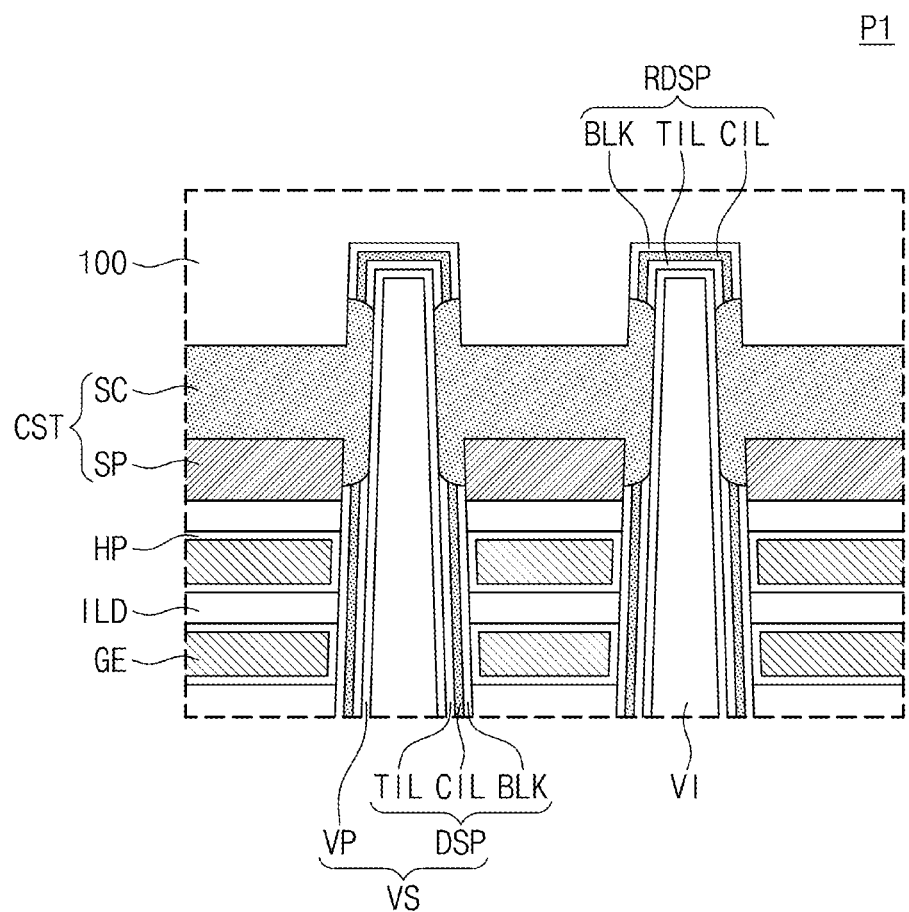
FIG. 7 is an enlarged sectional view illustrating a portion 'P1' of FIG. 6A.

FIG. 5 is a plan view illustrating a cell array structure of a semiconductor device according to an embodiment of the inventive concept. FIGS. 6A and 6B are sectional views, which are respectively taken along lines A-A' and B-B' of FIG. 5 to illustrate a three-dimensional semiconductor memory device according to an embodiment of the inventive concept. FIG. 7 is an enlarged sectional view illustrating a portion 'P1' of FIG. 6A.

A semiconductor device according to an embodiment of the inventive concept may have a chip-to-chip (C2C) structure. In the C2C structure, an upper chip including a cell array structure CS may be fabricated on a first semiconductor substrate (i.e., a first wafer), a lower chip including a peripheral circuit structure PS may be fabricated on a second semiconductor substrate 20 (i.e., a second wafer) different from the first semiconductor substrate, and then, the upper chip and the lower chip may be connected to each other through a bonding process. Here, the bonding process may be performed to electrically connect a bonding metal pad, which is formed in the uppermost metal layer of the upper chip, to a bonding metal pad, which is formed in the uppermost metal layer of the lower chip. For example, in the case where the bonding metal pad is formed of copper (Cu), the bonding process may be performed in a Cu-to-Cu bonding manner, but in an embodiment, the bonding metal pad may be formed of or include aluminum (Al) or tungsten (W).

The cell array structure CS may include a semiconductor layer 100 and a memory cell array including memory cells, which are three-dimensionally arranged on the semiconductor layer 100. The memory cell array may be electrically connected to first bonding pads BP1.

In detail, the cell array structure CS may include the semiconductor layer 100, a source structure CST, a stack ST, vertical structures VS, bit lines BL, a resistor pattern RP, cell and peripheral contact plugs CPLG and PPLG, and an input/output contact plug IOPLG.

The cell array structure CS may include a cell array region CAR and first and second connection regions CNR1 and CNR2, and the first connection region CNR1 may be positioned between the cell array region CAR and the second connection region CNR2 in a first direction D1.

In the cell array region CAR and the first connection region CNR1, the semiconductor layer 100 of the cell array structure CS may be disposed on a top surface of a lower insulating layer 50. The semiconductor layer 100 may be formed of a semiconductor material, an insulating material, or a conductive material. The semiconductor layer 100 may be formed of or include a doped semiconductor material of a first conductivity type (e.g., n-type) and/or an undoped or intrinsic semiconductor material. The semiconductor layer 100 may be formed to have one of single-crystalline, poly-crystalline, and amorphous structures. As an example, the semiconductor layer 100 may be formed of a poly-silicon layer.

The resistor pattern RP may be disposed on the top surface of the lower insulating layer 50 and in the second connection region CNR2 and may be horizontally spaced apart from the semiconductor layer 100.

The resistor pattern RP may be formed of or include the same material (e.g., polysilicon) as the semiconductor layer 100. The resistor pattern RP may have substantially the same thickness as the semiconductor layer 100. As an example, a top surface of the resistor pattern RP (e.g., a surface of the resistor pattern RP that is closest to the peripheral circuit structure PS) may be positioned at substantially the same level as the top surface of the semiconductor layer 100 (e.g., a surface of the semiconductor layer 100 that faces a source semiconductor pattern SC). In an embodiment, the resistor pattern RP may be positioned at a level that is different from (e.g., lower than) the source structure CST provided in the cell array region CAR.

The resistor pattern RP may include a plurality of line portions, which are connected to each other. A resistance value of the resistor pattern RP may depend on a width and a thickness of the resistor pattern RP. In addition, the resistance value of the resistor pattern RP may be increased by increasing an effective length of the resistor pattern RP.

A first gap-fill insulating pattern 110 may be disposed in the second connection region CNR2 to cover a side surface of the semiconductor layer 100 and a side surface of the resistor pattern RP. The first gap-fill insulating pattern 110 may have a top surface which is substantially coplanar with the top surface of the semiconductor layer 100 and the top surface of the resistor pattern RP. The first gap-fill insulating pattern 110 may be formed of or include at least one of insulating materials (e.g., silicon oxide and silicon nitride).

The source structure CST may be disposed on the semiconductor layer 100. The source structure CST may include a source semiconductor pattern SC and a support semiconductor pattern SP on the source semiconductor pattern SC. The source structure CST may be parallel to the top surface of the semiconductor layer 100 and, in the cell array region CAR and the first connection region CNR1, it may be extended parallel to the stack ST or in the first direction D1.

The source semiconductor pattern SC may be formed of or include a semiconductor material that is doped with dopants (e.g., phosphorus (P) or arsenic (As)) of a first conductivity type. As an example, the source semiconductor pattern SC may be formed of an n-type doped poly-silicon layer.

The support semiconductor pattern SP may cover a top surface of the source semiconductor pattern SC and may be formed of or include a doped semiconductor material of the first conductivity type (e.g., an n-type doped poly-silicon layer) and/or an undoped or intrinsic semiconductor material. A concentration of the n-type dopants in the support semiconductor pattern SP may be lower than that in the source semiconductor pattern SC. In the cell array region CAR, portions of the support semiconductor pattern SP may be provided to penetrate the source semiconductor pattern SC and to be in contact with the semiconductor layer 100.

The stack ST may be disposed on the source structure CST. The stack ST may include electrodes GE and insulating layers ILD, which are alternately stacked in a third direction D3 (i.e., a vertical direction), and here, the third direction D3 may be perpendicular to first and second directions D1 and D2 that cross each other.

The electrodes GE may be formed of or include at least one of, for example, doped semiconductor materials (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth). The insulating layers ILD may include a silicon oxide layer and/or a low-k dielectric layer. In an embodiment, the semiconductor device may be a vertical-type NAND FLASH memory device, and in this case, the electrodes GE of the stack ST may be used as the gate lower lines LL1 and LL2, the word lines WL, and the gate upper lines UL1 and UL2 described with reference to FIG. 1.

The electrodes GE may be stacked on the source structure CST to have a staircase structure in the first connection region CNR1. Each of the electrodes GE may include a pad portion provided on the first connection region CNR1. The pad portions of the electrodes GE may be located at positions that are different from each other in both of horizontal and vertical directions. The cell contact plugs CPLG may be coupled to the pad portions of the electrodes GE, respectively.

First, second, and third separation structures SS1, SS2, and SS3 may be provided on the semiconductor layer 100 to penetrate the stack ST. The first separation structures SS1 may be extended from the cell array region CAR to the first connection region CNR1 in the first direction D1 and may be spaced apart from each other in the second direction D2 crossing the first direction D1. The second separation structure SS2 may be provided to penetrate the stack ST in the cell array region CAR. The second separation structure SS2 may be disposed between the first separation structures SS1. When measured in the first direction D1, a length of the second separation structure SS2 may be smaller than a length of the first separation structure SS1. In another embodiment, a plurality of the second separation structures SS2 may be provided between the first separation structures SS1. In the first connection region CNR1, the third separation structures SS3 may be spaced apart from the first and second separation structures SS1 and SS2 and may penetrate a planarization insulating layer 120 and the stack ST. The third separation structures SS3 may be extended in the first direction D1 and may be spaced apart from each other in the second direction D2. Each of the first, second, and third separation structures SS1, SS2, and SS3 may include an insulating layer covering the side surface of the stack ST.

The vertical structures VS may be provided in the cell array region CAR to penetrate the stack ST. Dummy vertical structures DVS may be provided in the first connection region CNR1 to penetrate the pad portions of the electrodes GE, and in an embodiment, the dummy vertical structures DVS may have substantially the same structure and material as the vertical structures VS.

In detail, referring to FIG. 7, each of the vertical structures VS may include a vertical semiconductor pattern VP and a data storage pattern DSP, which is provided to enclose a side surface of the vertical semiconductor pattern VP. In detail, the vertical semiconductor pattern VP may have a pipe or macaroni shape with closed bottom. The vertical semiconductor pattern VP may have a 'U'-shaped section and an internal space of the vertical semiconductor pattern VP may be filled with an insulating material. The vertical semiconductor pattern VP may be formed of or include at least one of various semiconductor materials (e.g., silicon (Si) or germanium (Ge)). The vertical semiconductor pattern VP, which is formed of or includes a semiconductor material, may be used as channel regions of the upper transistors UT1 and UT2, the memory cell transistors MCT, and the lower transistors LT1 and LT2 described with reference to FIG. 1.

The data storage pattern DSP may be extended in the third direction D3 and may enclose the side surface of the vertical semiconductor pattern VP. The data storage pattern DSP may be a pipe- or macaroni-shape pattern with open top and bottom. The data storage pattern DSP may be composed of one or more layers. In an embodiment, the data storage pattern DSP may be a data storing layer of a NAND FLASH memory device and may include a tunnel insulating layer TIL, a charge storing layer CIL, and a blocking insulating layer BLK, which are sequentially stacked on the side surface of the vertical semiconductor pattern VP. For example, the charge storing layer CIL may be a trap insulating layer, a floating gate electrode, or an insulating layer with conductive nanodots. In addition, a remnant data storage pattern RDSP may be disposed in the semiconductor layer 100 to be vertically spaced apart from the data storage pattern DSP. The remnant data storage pattern RDSP may have substantially the same layer structure as the data storage pattern DSP.

A horizontal insulating pattern HP may be provided between the side surfaces of the electrodes GE and the data storage pattern DSP. The horizontal insulating pattern HP may be extended from the side surfaces of the electrodes GE to cover top and bottom surfaces of the electrodes GE.

A portion of the side surface of the vertical semiconductor pattern VP of each vertical structure VS may be in contact with the source semiconductor pattern SC. In each vertical structure VS, a bottom surface of the data storage pattern DSP may be positioned at a level that is lower than a bottom surface of the lowermost one of the electrodes GE and is higher than the top surface of the source semiconductor pattern SC.

Referring back to FIGS. 5, 6A, and 6B, the planarization insulating layer 120 may cover the staircase structure of the stack ST. The planarization insulating layer 120 may have a substantially flat top surface. The planarization insulating layer 120 may include a single insulating layer or a plurality of stacked insulating layers. Interlayer insulating layers 130, 140, 150, 160, and 170 may be sequentially formed on the planarization insulating layer 120. The interlayer insulating layers 130, 140, 150, 160, and 170 may be formed of or include at least one of various insulating materials (e.g., silicon oxide and silicon nitride).

The bit lines BL may be disposed on the second interlayer insulating layer 140 and in the cell array region CAR and may be extended in the second direction D2 to cross the stack ST. The bit lines BL may be electrically connected to the vertical structures VS through bit line contact plugs BCT.

The cell contact plugs CPLG may be provided in the first connection region CNR1 to penetrate the first and second interlayer insulating layers 130 and 140 and the planarization insulating layer 120 and may be coupled to the pad portions of the electrodes GE, respectively. The smaller the distance to the cell array region CAR, the smaller the vertical lengths of the cell contact plugs CPLG. The cell contact plugs CPLG may have top surfaces that are substantially coplanar with each other.

The peripheral contact plugs PPLG may be provided in the second connection region CNR2 to penetrate the first and second interlayer insulating layers 130 and 140 and the planarization insulating layer 120 and may be coupled to the resistor pattern RP. Top surfaces of the peripheral contact plugs PPLG may be substantially coplanar with the top surfaces of the cell contact plugs CPLG.

The input/output contact plug IOPLG may be electrically connected to an input/output pad PAD in the second connection region CNR2. The input/output contact plugs IOPLG may be spaced apart from the semiconductor layer 100 and the resistor pattern RP. The input/output contact plugs IOPLG may be provided to penetrate the first and second interlayer insulating layers 130 and 140, the planarization insulating layer 120, the first and second gap-fill insulating patterns 110 and 115, and the lower insulating layer 50.

Each of the cell, peripheral, and input/output contact plugs CPLG, PPLG, and IOPLG may include a barrier metal layer, which is formed of or includes a conductive metal nitride (e.g., titanium nitride, tantalum nitride, and so forth), and a metal layer, which is formed of or includes a metallic material (e.g., tungsten, titanium, tantalum, and so forth).

First lower conductive lines LCLa may be disposed on the second interlayer insulating layer 140 of the first connection region CNR1 and may be coupled to the cell contact plugs CPLG through first connection contact plugs LCTa.

Second lower conductive lines LCLb may be disposed on the second interlayer insulating layer 140 of the second connection region CNR2 and may be coupled to the peripheral contact plugs PPLG and the input/output contact plugs IOPLG through second connection contact plugs LCTb.

A third interlayer insulating layer 150 may cover the bit lines BL and the first and second lower conductive lines LCLa and LCLb.

First and second upper conductive lines UCLa and UCLb may be disposed in a fourth interlayer insulating layer 160. The first upper conductive lines UCLa may be electrically connected to the bit lines BL or the first lower conductive lines LCLa in the cell array region CAR and the first connection region CNR1. The second upper conductive lines UCLb may be electrically connected to the second lower conductive lines LCLb in the second connection region CNR2.

The first and second lower conductive lines LCLa and LCLb and the first and second upper conductive lines UCLa and UCLb may be formed of or include at least one of metals (e.g., tungsten, copper, aluminum, and so forth), conductive metal nitrides (e.g., titanium nitride, tantalum nitride, and so forth), or transition metals (e.g., titanium, tantalum, and so forth). For example, the first and second lower conductive lines LCLa and LCLb may be formed of or include a material (e.g., tungsten) having relatively high electric resistivity, and the first and second upper conductive lines UCLa and UCLb may be formed of or include a material (e.g., copper) having relatively low electric resistivity.

The first bonding pads BP1 may be provided in the uppermost interlayer insulating layer (e.g., the fifth interlayer insulating layer 170). The first bonding pads BP1 may be electrically connected to the first and second upper conductive lines UCLa and UCLb. The first bonding pads BP1 may be formed of or include at least one of, for example, aluminum, copper, or tungsten.

The first bonding pads BP1 may be electrically and physically connected to second bonding pads BP2 of the peripheral circuit structure PS in a bonding manner. That is, the second bonding pads BP2 may be in direct contact with the first bonding pads BP1.

The peripheral circuit structure PS may be formed on the second semiconductor substrate 20 and may include peripheral circuits PTR controlling the memory cell array and peripheral interlayer insulating layers 210 and 220 covering the peripheral circuits PTR. The peripheral circuits PTR may be integrated on a top surface of the second semiconductor substrate 20. A surface insulating layer 201 may be provided on a rear surface of the second semiconductor substrate 20.

The peripheral circuits PTR may include row and column decoders, a page buffer, a control circuit, and so forth. In detail, the peripheral circuits PTR may include NMOS and PMOS transistors. Peripheral circuit interconnection lines PLP may be electrically connected to the peripheral circuits PTR through peripheral contact plugs PCP.

The peripheral interlayer insulating layers 210 and 220 may be provided on a top surface of the second semiconductor substrate 20. The peripheral interlayer insulating layers 210 and 220 may cover the peripheral circuits PTR, the peripheral contact plugs PCP, and the peripheral circuit interconnection lines PLP, on the second semiconductor substrate 20. The peripheral contact plugs PCP and the peripheral circuit interconnection lines PLP may be electrically connected to the peripheral circuits PTR. Each of the peripheral interlayer insulating layers 210 and 220 may include a silicon oxide layer, a silicon nitride layer, a silicon oxynitride layer, and/or a low-k dielectric layer.

The second bonding pads BP2 may be provided in the uppermost layer (i.e., 220) of the peripheral interlayer insulating layers to correspond to the first bonding pads BP1. The second bonding pads BP2 may be electrically connected to the peripheral circuits PTR through the peripheral circuit interconnection lines PLP and the peripheral contact plugs PCP.

The second bonding pads BP2 may be formed of or include the same metallic material as the first bonding pads BP1. The second bonding pads BP2 may have substantially the same shape, the same width, or the same area as the first bonding pads BP1.

The input/output pads PAD may be disposed on a capping insulating layer 310, which is formed to cover a bottom surface of the lower insulating layer 50 of the cell array structure CS. The input/output pads PAD may be electrically connected to the peripheral circuits PTR of the peripheral circuit structure PS through the input/output contact plug IOPLG.

A protection layer 320 and 330 and a passivation layer 340 may be sequentially formed on the capping insulating layer 310. The protection layer 320 and 330 may be, for example, a silicon nitride layer or a silicon oxynitride layer. The passivation layer 340 may be formed of or include a polyimide-based material (e.g., photo-sensitive polyimide (PSPI)).

The protection layer 320 and 330 and the passivation layer 340 may be formed to have a pad opening OP exposing a portion of the input/output pad PAD.

Hereinafter, the fabricating methods according to other embodiments of the inventive concept will be described below. However, the same features as those in the previously-described drawings may be omitted, for concise description.

FIGS. 8 to 13 are sectional views, which are taken along a line A-A' of FIG. 5 to illustrate a three-dimensional semiconductor memory device according to an embodiment of the inventive concept. FIG. 14 is an enlarged sectional view illustrating a portion 'P2' of FIG. 13.

Figure 8:
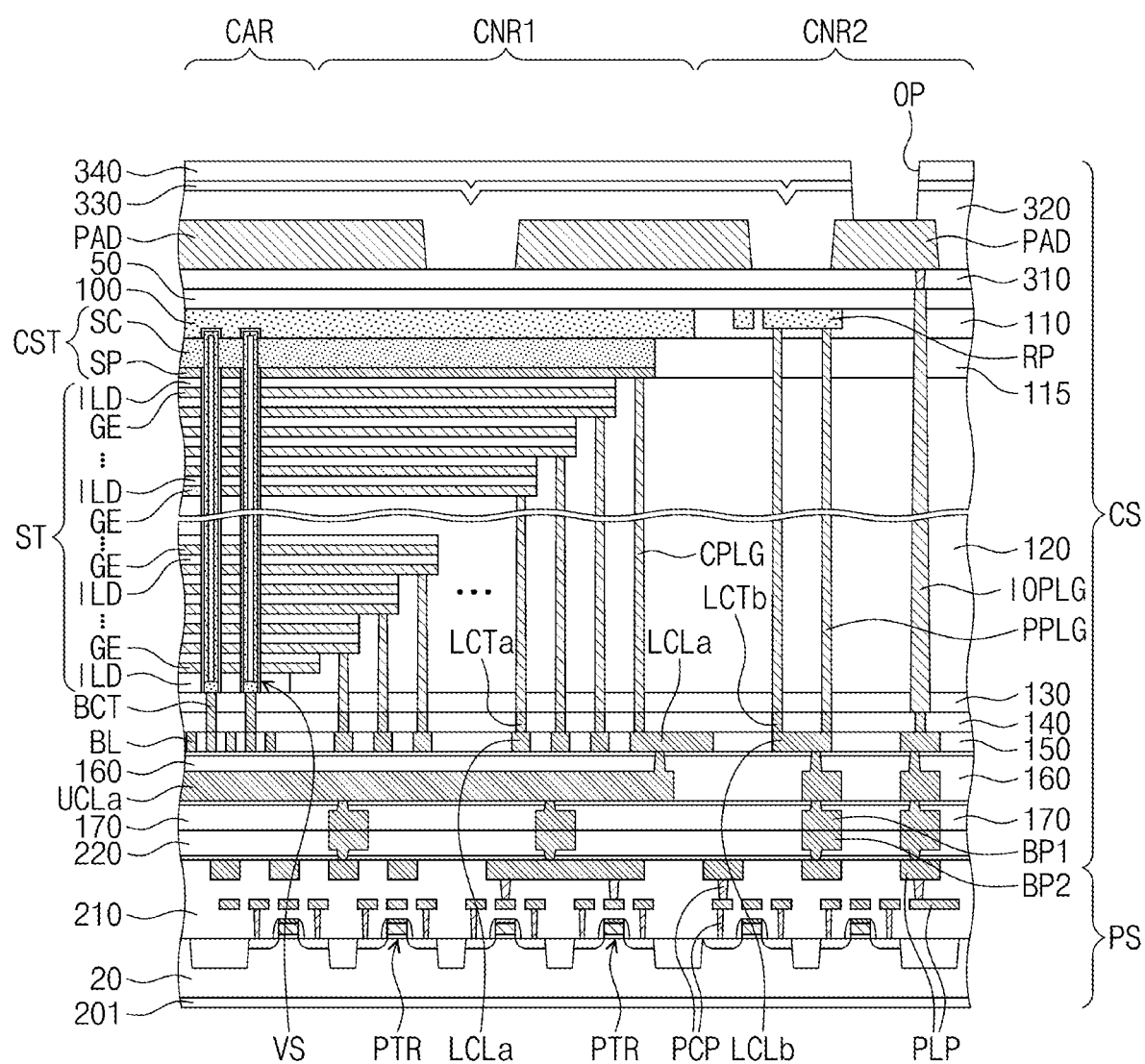
FIGS. 8 to 13 are sectional views, which are taken along a line A-A' of FIG. 5 to illustrate a three-dimensional semiconductor memory device according to an embodiment of the inventive concept.

In the embodiment shown in FIG. 8, the cell array structure CS may include the semiconductor layer 100, the source structure CST, the stack ST, the vertical structures VS, the bit lines BL, the resistor pattern RP, the cell and peripheral contact plugs CPLG and PPLG, and the input/output contact plug IOPLG.

In the present embodiment, the resistor pattern RP may be formed of or include the same semiconductor material as the semiconductor layer 100, but on the lower insulating layer 50, it may have a thickness different from the semiconductor layer 100. As an example, the thickness of the resistor pattern RP may be smaller than the thickness of the semiconductor layer 100. In other words, a top surface of the resistor pattern RP may be positioned at a level lower than the top surface of the semiconductor layer 100.

Figure 9:
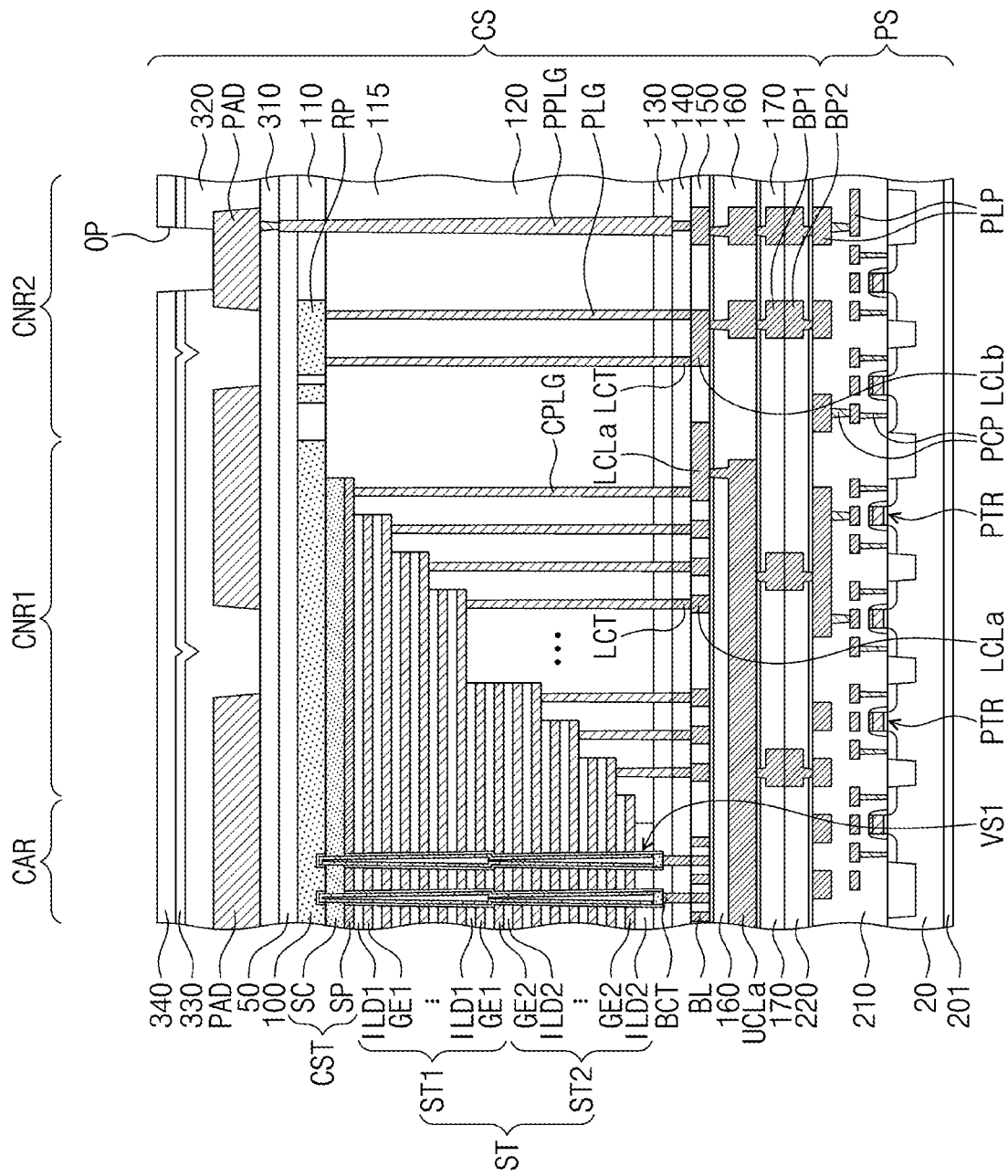

In the embodiment shown in FIG. 9, the stack ST on the semiconductor layer 100 may include a first stack ST1 and a second stack ST2 on the first stack ST1. The first stack ST1 may include first electrodes GE1, which are stacked in a direction perpendicular to the semiconductor layer 100 (i.e., in the third direction D3). The first stack ST1 may further include first insulating layers ILD1, which separate the stacked first electrodes GE1 from each other. The first insulating layers ILD1 and the first electrodes GE1 of the first stack ST1 may be alternately stacked in the third direction D3. A second insulating layer ILD2 may be provided at the uppermost level of the first stack ST1.

The second stack ST2 may include second electrodes GE2, which are stacked on the first stack ST1 in the third direction D3. The second stack ST2 may further include the second insulating layers ILD2, which separate the stacked second electrodes GE2 from each other. The second insulating layers ILD2 and the second electrodes GE2 of the second stack ST2 may be alternately stacked in the third direction D3.

Each of the vertical structures VS may include a first vertically-extended portion penetrating the first stack ST1, a second vertically-extended portion penetrating the second stack ST2, and an expanded portion between the first and second vertically-extended portions. The expanded portion may be provided in the uppermost one of the first insulating layers ILD1. A diameter of the vertical structure VS may be rapidly increased at the expanded portion.

Figure 10:
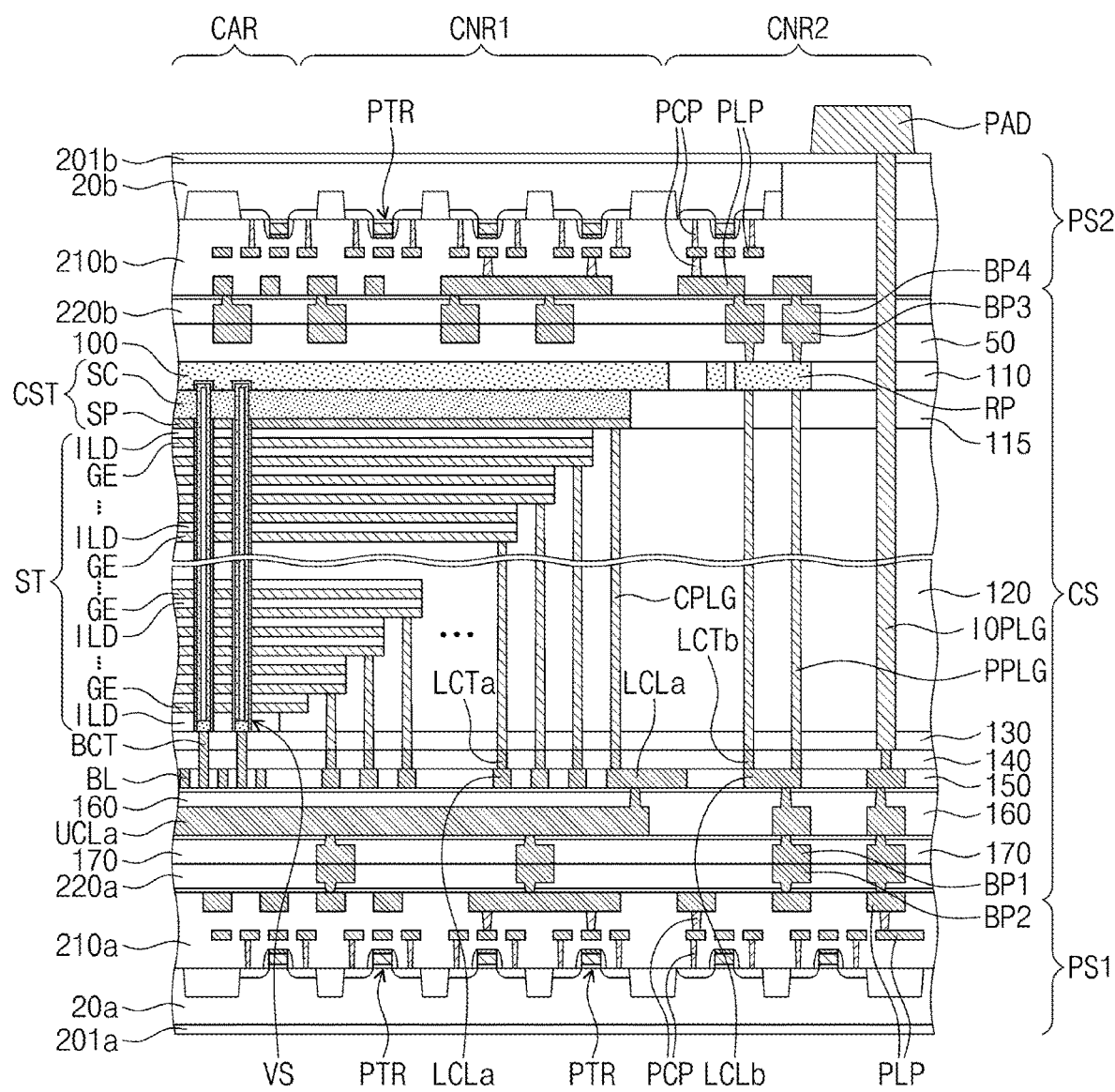

In the embodiment shown in FIG. 10, the semiconductor device may include the cell array structure CS and first and second peripheral circuit structures PS1 and PS2. The cell array structure CS may be provided between the first and second peripheral circuit structures PS1 and PS2.

The cell array structure CS may include first lower bonding pads BP1 and first upper bonding pads BP3. The first lower bonding pads BP1 may be provided in the uppermost interlayer insulating layer (e.g., the fifth interlayer insulating layer 170). The first upper bonding pads BP3 may be provided in the lower insulating layer 50. Some of the first upper bonding pads BP3 may be connected to the resistor pattern RP.

The first peripheral circuit structure PS1 may include the peripheral circuits PTR on a second semiconductor substrate 20a, first peripheral interlayer insulating layers 210a and 220a covering the peripheral circuits PTR, and second lower bonding pads BP2.

The first peripheral interlayer insulating layers 210a and 220a may be provided on a top surface of the second semiconductor substrate 20a. The upper surface insulating layer 201a may be provided on a bottom surface of the second semiconductor substrate 20a.

The second lower bonding pads BP2 may be provided in the uppermost one of the first peripheral interlayer insulating layers (e.g., the first peripheral interlayer insulating layer 220a) to correspond to the first lower bonding pads BP1. The second lower bonding pads BP2 may be electrically and physically connected to the first lower bonding pads BP1 in a bonding manner. The uppermost peripheral interlayer insulating layer (e.g., the first peripheral interlayer insulating layer 220a) may be in direct contact with the uppermost interlayer insulating layer (e.g., the fifth interlayer insulating layer 170) of the cell array structure CS.

The second peripheral circuit structure PS2 may include the peripheral circuits PTR on a third semiconductor substrate 20b, second peripheral interlayer insulating layers 210b and 220b covering the peripheral circuits PTR, and second upper bonding pads BP4. The second peripheral interlayer insulating layers 210b and 220b may be provided on a top surface of the third semiconductor substrate 20b. The second peripheral interlayer insulating layer 210b may penetrate a portion of the third semiconductor substrate 20b and may surround a portion of the input/output contact plug IOPLG.

The second upper bonding pads BP4 may be provided in the uppermost one of the second peripheral interlayer insulating layers (e.g., the second peripheral interlayer insulating layer 220b) to correspond to the first upper bonding pads BP3. The second upper bonding pads BP4 may have substantially the same shape, the same width, or the same area as the first upper bonding pads BP3. The second upper bonding pads BP4 may be electrically and physically connected to the first upper bonding pads BP3 in a bonding manner. The uppermost one of the second peripheral interlayer insulating layers (e.g., the second peripheral interlayer insulating layer 220b) may be in direct contact with the lower insulating layer 50 of the cell array structure CS.

The lower surface insulating layer 201b may be provided on a bottom surface of the third semiconductor substrate 20b, and the input/output pad PAD may be disposed on the lower surface insulating layer 201b.

In the second connection region CNR2, the input/output contact plug IOPLG may be electrically connected to the input/output pad PAD. The input/output contact plug IOPLG may be provided to penetrate a portion of the cell array structure CS and the second peripheral circuit structure PS2.

Figure 11:
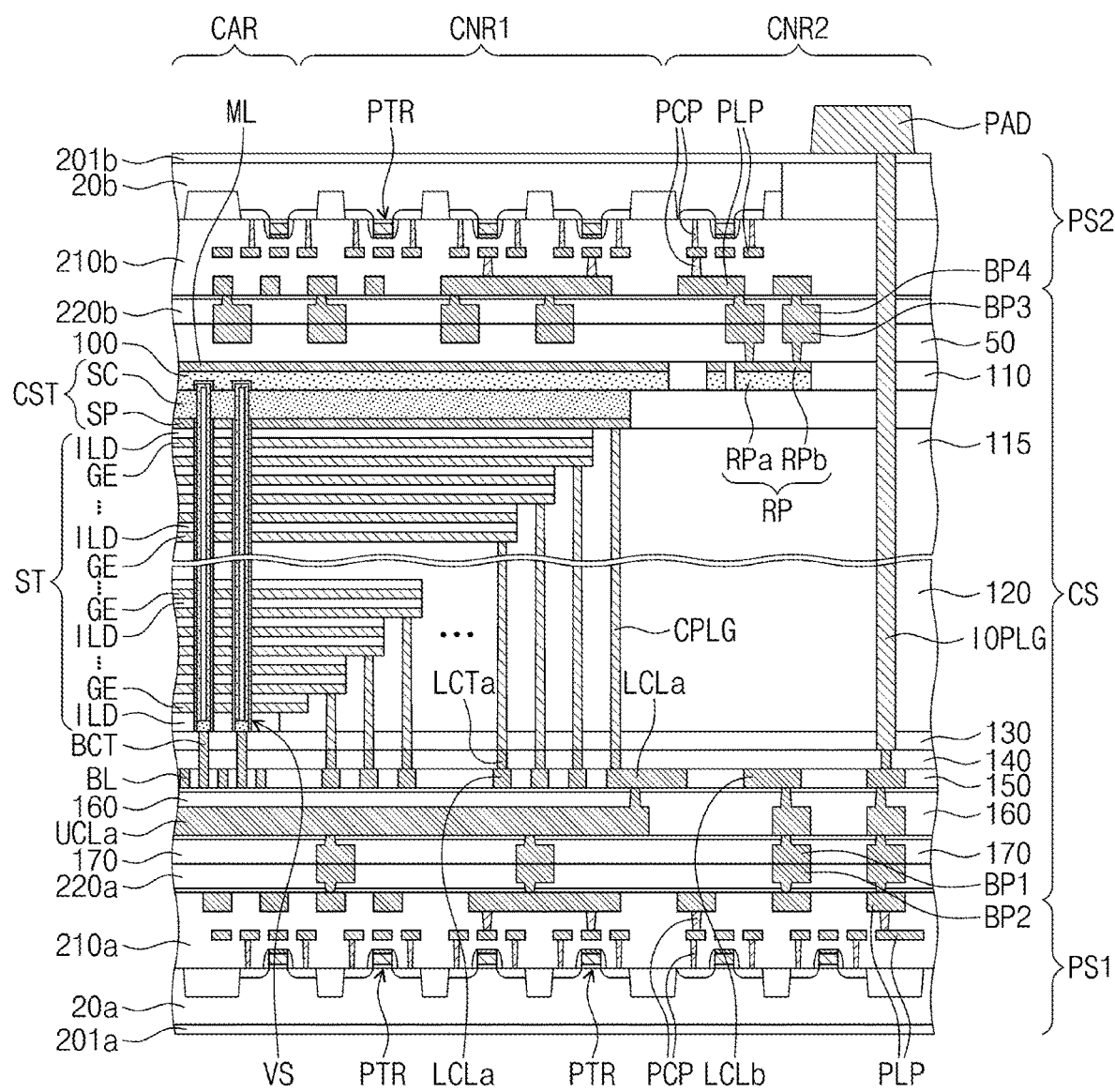

In the embodiment shown in FIG. 11, the semiconductor device may include the first and second peripheral circuit structures PS1 and PS2 and the cell array structure CS, as described with reference to FIG. 10.

In the cell array structure CS, a plate metal layer ML may be disposed between the semiconductor layer 100 and the lower insulating layer 50.

The resistor pattern RP may include an upper resistor pattern RPa and a lower resistor pattern RPb. The upper resistor pattern RPa may be formed of or include the same semiconductor material as the semiconductor layer 100 and may have substantially the same thickness as the semiconductor layer 100. The lower resistor pattern RPb may be formed of or include the same metallic material as the plate metal layer ML and may have substantially the same thickness as the plate metal layer ML.

Figure 12:
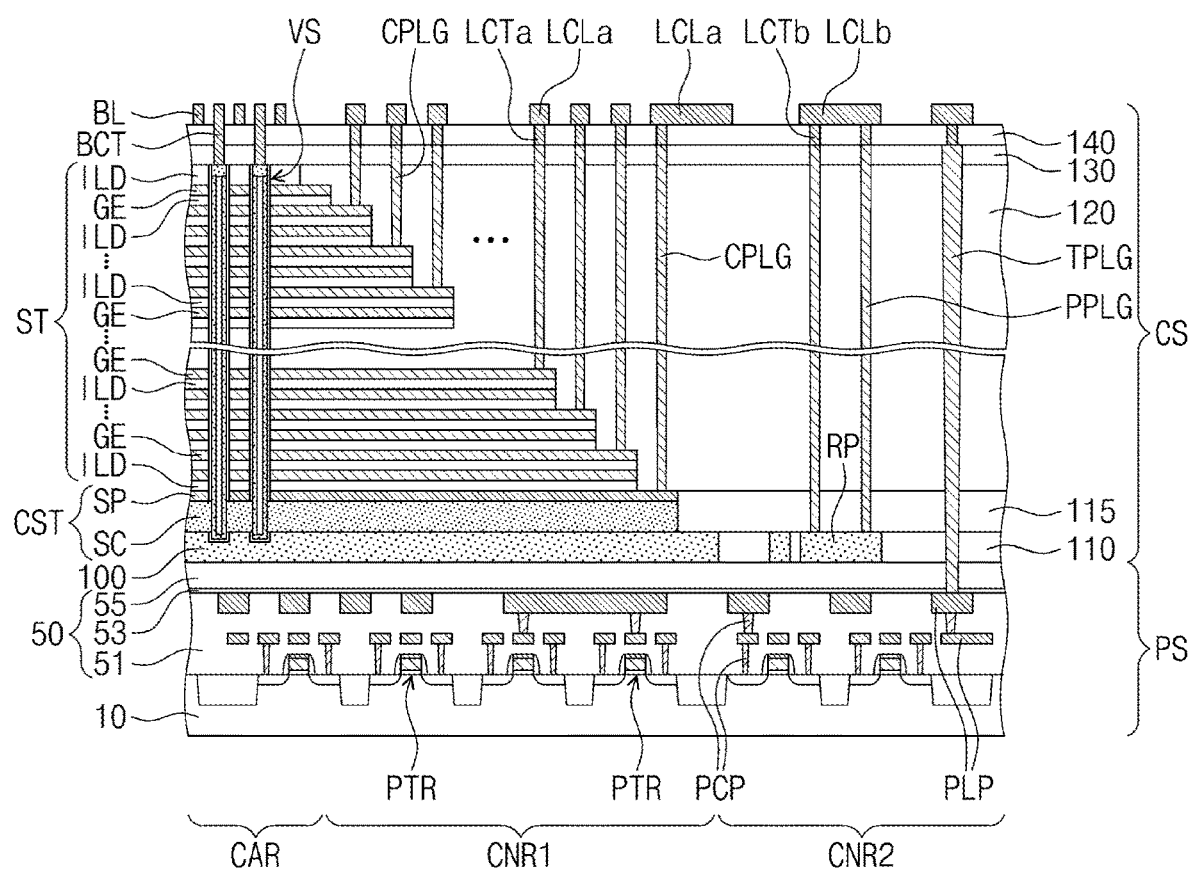

In the embodiment shown in FIG. 12, the semiconductor device may include the peripheral circuit structure PS and the cell array structure CS on the peripheral circuit structure PS.

The peripheral circuit structure PS may include the peripheral circuits PTR integrated on the first semiconductor substrate 10. The lower insulating layer 50 may be provided on the first semiconductor substrate 10 to cover the peripheral circuits PTR. The lower insulating layer 50 may include a plurality of vertically-stacked insulating layers. In an implementation, the lower insulating layer 50 may include a silicon oxide layer, a silicon nitride layer, a silicon oxynitride layer, or a low-k dielectric layer. In an implementation, the lower insulating layer 50 may include a first lower insulating layer 51, a second lower insulating layer 55, and an etch stop layer 53 between the first and second lower insulating layers 51 and 55. The etch stop layer 53 may be formed of or include an insulating material different from the first and second lower insulating layers 51 and 55 and may cover top surfaces of the landing pads PLP.

The semiconductor layer 100 and the resistor pattern RP of the cell array structure CS may be disposed on the lower insulating layer 50. The peripheral contact plugs PPLG may be provided to penetrate the planarization insulating layer 120 and may be coupled to the resistor pattern RP.

The cell array structure CS may be electrically connected to the peripheral circuit structure PS through a penetration plug TPLG, which is provided in the second connection region CNR2. The penetration plug TPLG may connect the lower interconnection lines LCLb of the cell array structure CS to the peripheral circuit interconnection line PLP of the peripheral circuit structure PS.

Figure 13:
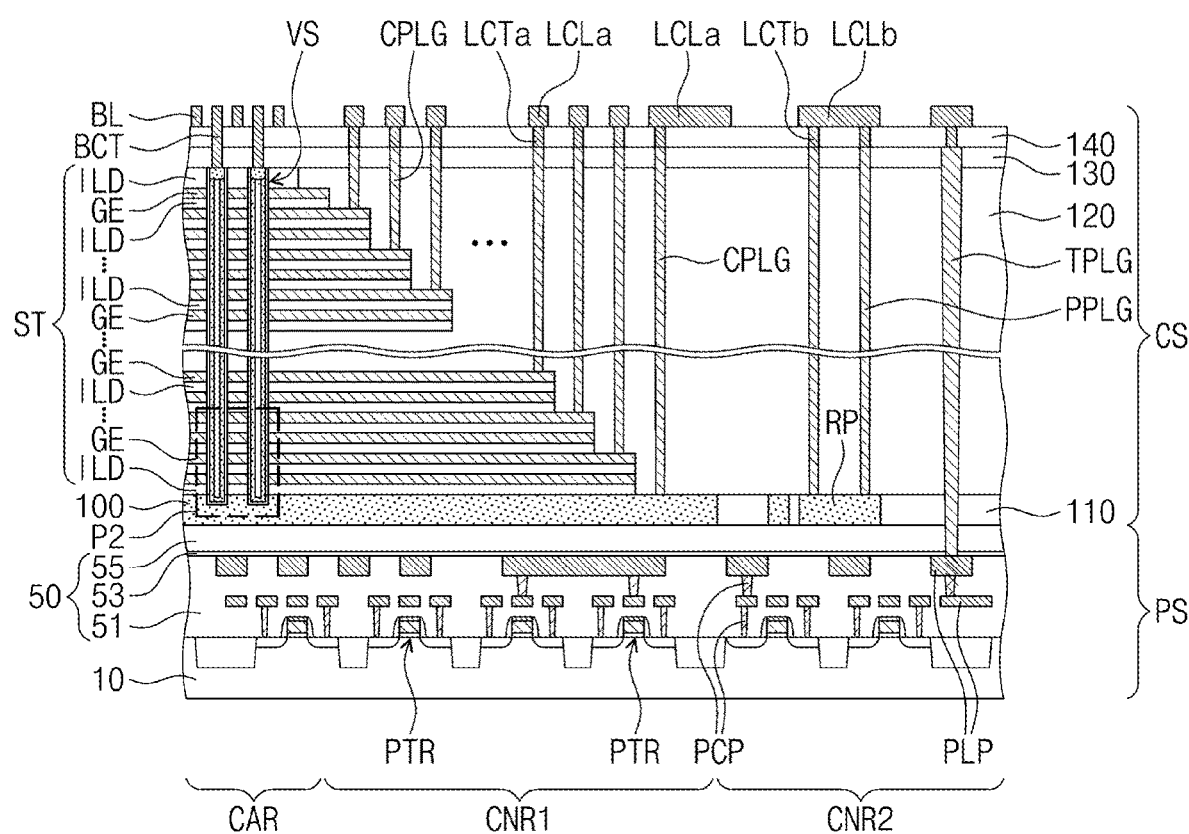
Figure 14:
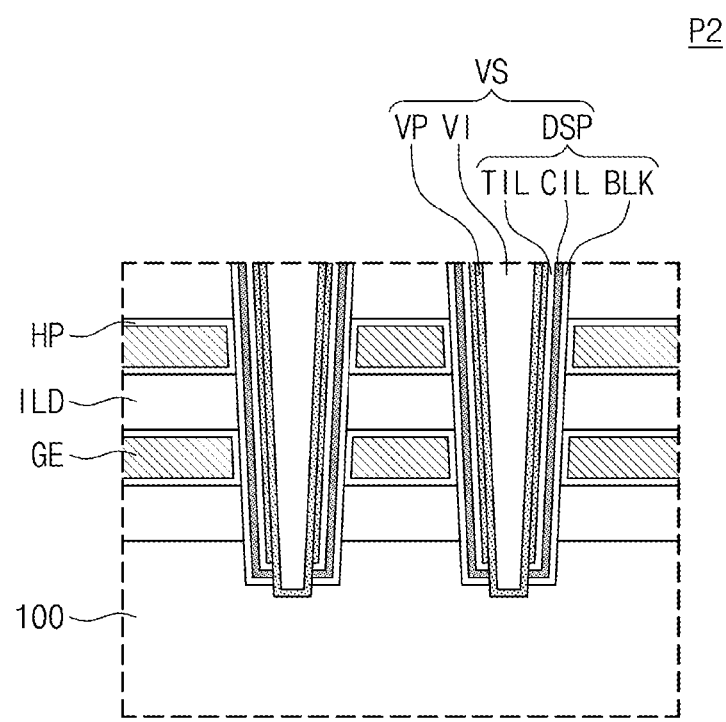
FIG. 14 is an enlarged sectional view illustrating a portion 'P2' of FIG. 13.

In the embodiment shown in FIG. 13, the semiconductor device may include the peripheral circuit structure PS and the cell array structure CS on the peripheral circuit structure PS.

In the present embodiment, the source structure CST may be omitted from the cell array structure CS. That is, the lowermost insulating layer ILD of the stack ST may be disposed on the top surface of the semiconductor layer 100.

The vertical structures VS may be provided to penetrate the stack ST and may be connected to the semiconductor layer 100. In detail, referring to FIG. 14, each of the vertical structures VS may include the data storage pattern DSP and the vertical semiconductor pattern VP. The vertical semiconductor pattern VP may be in contact with the semiconductor layer 100 and may be shaped like a pipe or letter with closed bottom.

The data storage pattern DSP may be extended in the third direction D3 and may be shaped like a pipe or macaroni with opened top and bottom. The data storage pattern DSP may be a data storing layer of the NAND FLASH memory device and may include the tunnel insulating layer TIL, the charge storing layer CIL, and the blocking insulating layer BLK, as previously described with reference to FIG. 7.

FIGS. 15 to 20 are sectional views (along a line A-A' of FIG. 5) illustrating a method of fabricating a semiconductor device according to an embodiment of the inventive concept.

Figure 15:
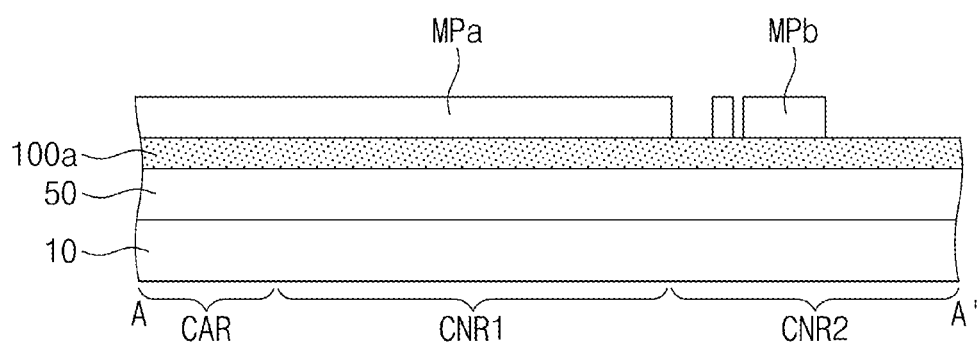
FIGS. 15 to 20 are sectional views illustrating a method of fabricating a semiconductor device according to an embodiment of the inventive concept.

Referring to FIG. 15, the lower insulating layer 50 may be formed on the first semiconductor substrate 10. The first semiconductor substrate 10 may be, for example, a single-crystalline silicon substrate or a silicon-on-insulator (SOI) substrate. The lower insulating layer 50 may be formed of or include at least one of, for example, silicon oxide, silicon nitride, silicon oxynitride, and/or low-k dielectric materials.

A preliminary semiconductor layer 100a may be formed by depositing a semiconductor material on the lower insulating layer 50. The preliminary semiconductor layer 100a may be formed of or include at least one of various semiconductor materials (e.g., silicon (Si), germanium (Ge), silicon germanium (SiGe), gallium arsenide (GaAs), indium gallium arsenide (InGaAs), or aluminum gallium arsenide (AlGaAs)). The preliminary semiconductor layer 100a may be formed of or include at least one of doped semiconductor materials and/or undoped or intrinsic semiconductor materials. The preliminary semiconductor layer 100a may be formed to have one of polycrystalline, amorphous, and single-crystalline structures. As an example, the preliminary semiconductor layer 100a may be formed by depositing a poly-silicon layer.

First and second mask patterns MPa and MPb may be formed on the preliminary semiconductor layer 100a.

The first mask pattern MPa may cover portions of the preliminary semiconductor layer 100a in the cell array region CAR and the first connection region CNR1. A second mask pattern MP2 may cover a portion of the preliminary semiconductor layer 100a in the second connection region CNR2.

The first mask pattern MPa may have a plate shape, when viewed in a plan view. A portion of the second mask pattern MPb may have a line-and-space shape, when viewed in a plan view.

An example in which the first and second mask patterns MPa and MPb are formed simultaneously is described, but the inventive concept is not limited to this example. For example, the first mask pattern MPa may be formed, the preliminary semiconductor layer 100a in the second connection region CNR2 may be partially etched, and then, the second mask pattern MPb may be formed in the second connection region CNR2.

Figure 16:
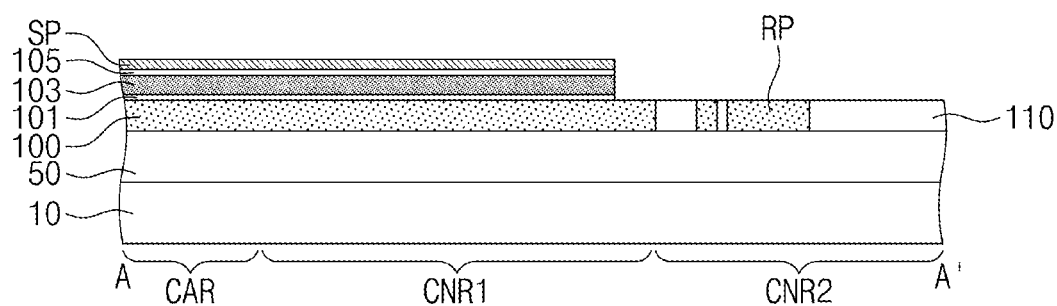

Referring to FIG. 16, the semiconductor layer 100 and the resistor pattern RP may be formed by anisotropically etching the preliminary semiconductor layer 100a using the first and second mask patterns MPa and MPb as an etch mask. Since the semiconductor layer 100 and the resistor pattern RP are formed at the same time, the resistor pattern RP may have substantially the same thickness as the semiconductor layer 100.

In an embodiment, the resistor pattern RP and the semiconductor layer 100 may be sequentially formed, and in this case, the resistor pattern RP may have a thickness different from the semiconductor layer 100.

After the formation of the resistor pattern RP and the semiconductor layer 100, the first gap-fill insulating pattern 110 may be formed on the lower insulating layer 50. The first gap-fill insulating pattern 110 may be formed by depositing an insulating layer on the lower insulating layer 50 to cover the semiconductor layer 100 and the resistor pattern RP and performing a planarization process to expose the top surface of the semiconductor layer 100.

After the formation of the first gap-fill insulating pattern 110, a first insulating layer 101, a second insulating layer 103, a third insulating layer 105, and a support semiconductor layer SP may be sequentially stacked on the semiconductor layer 100. The first insulating layer 101, the second insulating layer 103, the third insulating layer 105, and the support semiconductor layer SP may be formed to expose the resistor pattern RP and the first gap-fill insulating pattern 110 in the second connection region CNR2.

The first insulating layer 101 may be formed by thermally oxidizing a surface of the semiconductor layer 100 or by depositing a silicon oxide layer. The second insulating layer 103 may be formed of or include a material having an etch selectivity with respect to the first insulating layer 101 and the third insulating layer 105. In an embodiment, the second insulating layer 103 may be formed of or include at least one of silicon nitride, silicon oxynitride, silicon carbide, or silicon germanium. In an embodiment, the third insulating layer 105 may be a silicon oxide layer that is formed by a deposition process.

Figure 17:
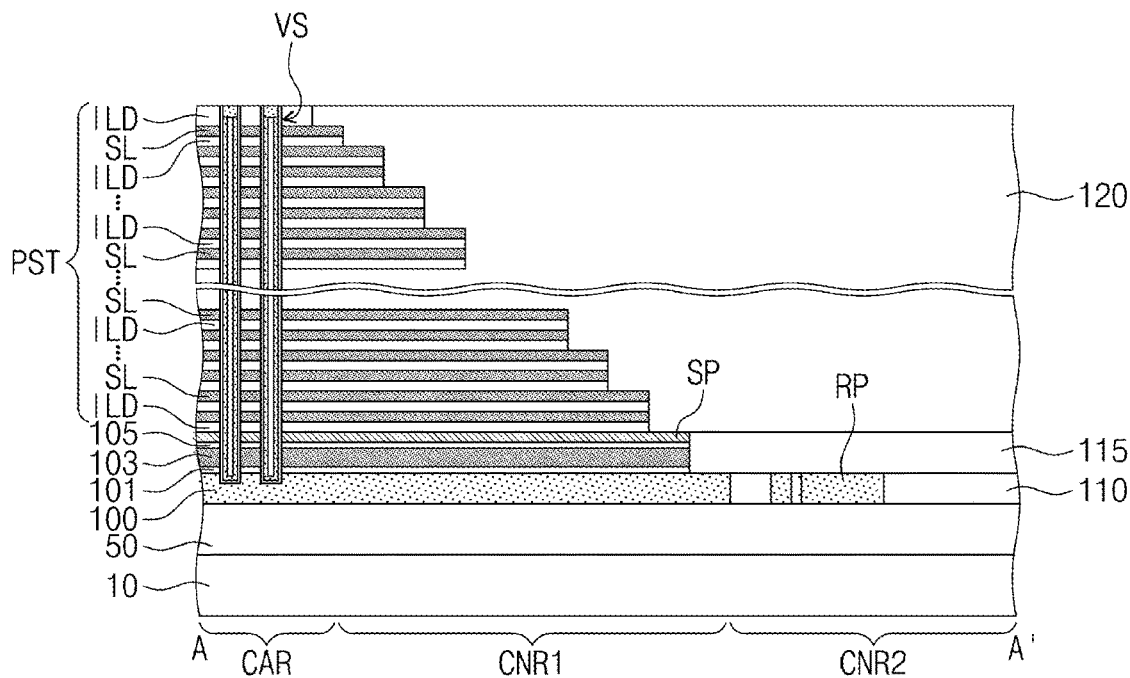

Referring to FIG. 17, the second gap-fill insulating pattern 115 may be formed in the second connection region CNR2 to cover side surfaces of the first insulating layer 101, the second insulating layer 103, the third insulating layer 105, and the support semiconductor layer SP.

The second gap-fill insulating pattern 115 may be formed by depositing an insulating material and performing a planarization process to expose a top surface of the support semiconductor layer SP.

After the formation of the second gap-fill insulating pattern 115, a mold structure PST, in which insulating layers ILD and sacrificial layers SL are vertically and alternately stacked, may be formed on the support semiconductor layer SP. The mold structure PST may be formed to have a staircase structure in a connection region CNR.

In the mold structure PST, the sacrificial layers SL may be formed of at least one of various materials that can be etched with a high etch selectivity with respect to the insulating layers ILD. For example, the sacrificial layers SL may be formed of an insulating material different from the insulating layers ILD. The sacrificial layers SL may be formed of the same material as the second insulating layer 103. As an example, the sacrificial layers SL may be formed of silicon nitride, whereas the insulating layers ILD may be formed of silicon oxide.

After the formation of the mold structure PST, the planarization insulating layer 120 may be formed on the second gap-fill insulating pattern 115 to cover the staircase structure of the mold structure PST.

Next, referring to FIGS. 5 and 17, the vertical structures VS may be formed to penetrate the mold structure PST. The vertical structures VS may include vertical structures, which are provided to penetrate the mold structure in the cell array region CAR, and dummy vertical structures, which are provided to penetrate the mold structure in the first connection region CNR1.

The formation of the vertical structures VS may include anisotropically etching the mold structure PST, the support semiconductor layer SP, and the first, second, and third insulating layers 101, 103, and 105 to form vertical holes penetrating the mold structure PST, the support semiconductor layer SP, and the first, second, and third insulating layers 101, 103, and 105 and sequentially depositing the data storage pattern DSP (e.g., of FIG. 7) and the vertical semiconductor pattern VP (e.g., of FIG. 7) in each of the vertical holes. In an embodiment, the anisotropic etching process to form the vertical holes may be performed in an over-etch way such that the top surface of the semiconductor layer 100 is partially etched, and in this case, lower portions of the vertical structures VS may be placed in the semiconductor layer 100.

The data storage pattern DSP may be formed to cover inner surfaces of the vertical holes conformally (for example, to a constant thickness). The data storage pattern DSP may include a tunneling insulating layer, a charge storing layer, and a blocking insulating layer, which are sequentially stacked.

The vertical semiconductor patterns VP may be formed in the vertical holes provided with the data storage pattern DSP, and bit line conductive pads may be formed on the vertical semiconductor patterns VP or in the uppermost portions thereof.

Figure 18:
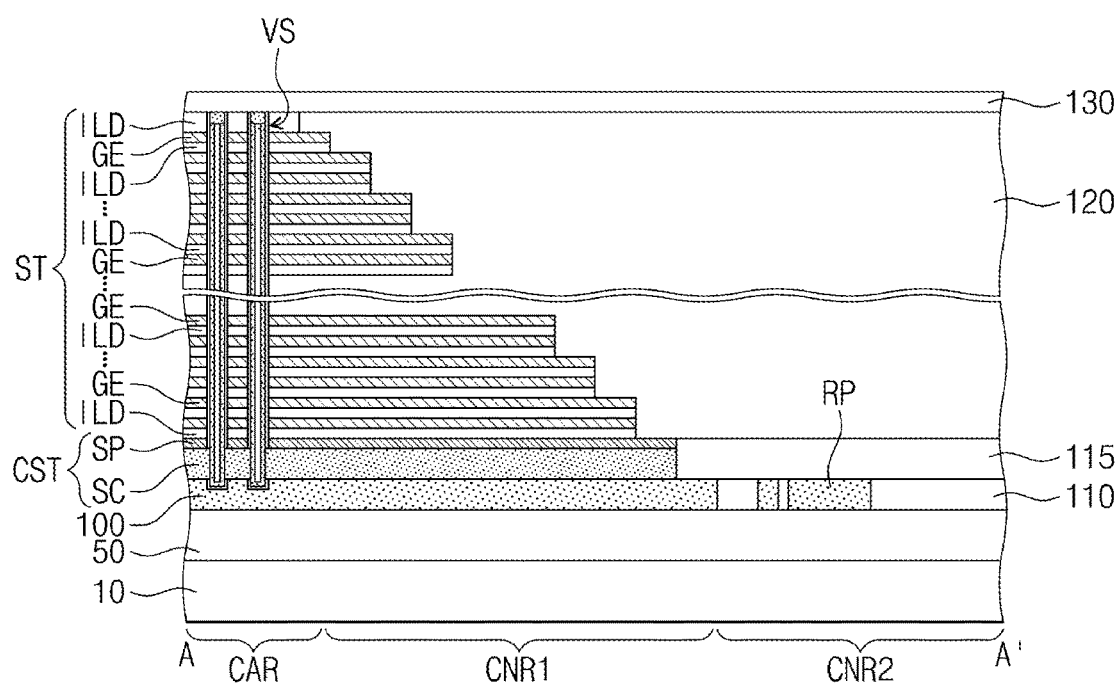

Referring to FIG. 18, after the formation of the vertical structures VS, the first interlayer insulating layer 130 may be formed on the planarization insulating layer 120 to cover top surfaces of the vertical structures VS.

After the formation of the first interlayer insulating layer 130, a replacement process may be performed to replace the first, second, and third insulating layers 101, 103, and 105 with the source semiconductor pattern SC. Accordingly, the source structure CST may be formed between the semiconductor layer 100 and the stack ST.

The formation of the source semiconductor pattern SC may include forming separation trenches to penetrate the mold structure PST and to expose the support semiconductor layer SP, performing an isotropic etching process on the first, second, and third insulating layers 101, 103, and 105 exposed through the separation trenches to form a horizontal recess region, and depositing a doped poly-silicon layer in the horizontal recess region. During the isotropic etching process on the first, second, and third insulating layers 101, 103, and 105, the data storing layer DSP (e.g., of FIG. 7) may be partially etched, and as a result, a portion of the vertical semiconductor pattern VP (e.g., of FIG. 7) may be exposed through the horizontal recess region.

After the formation of the source structure CST, the stack ST may be formed by replacing the sacrificial layers of the mold structure PST with the electrodes GE. The process to replace the sacrificial layers SL with the electrodes GE may include isotropically etching the sacrificial layers SL using an etch recipe, which is chosen to have an etch selectivity with respect to the insulating layers ILD, the vertical structures VS, and the source structure CST.

Figure 19:
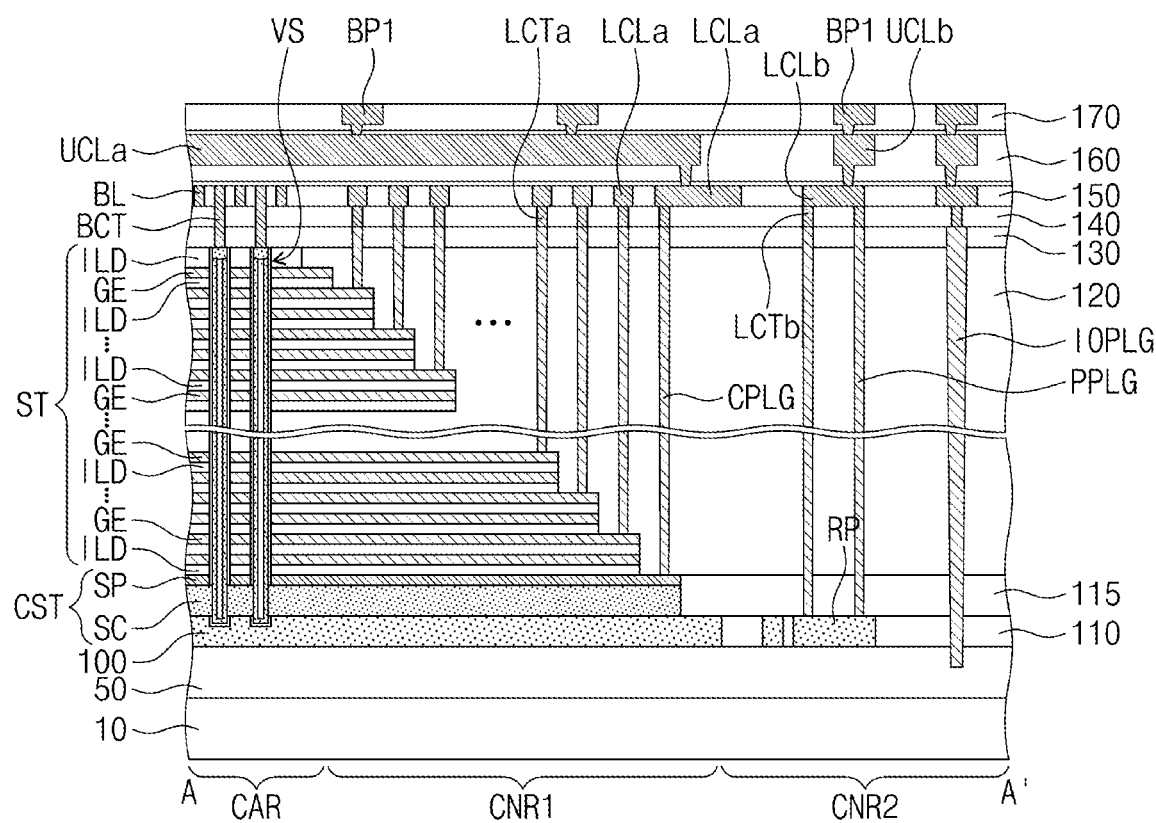

Referring to FIG. 19, the cell contact plugs CPLG connected to the stack ST, the peripheral contact plugs PPLG connected to the resistor pattern RP, and the input/output contact plug IOPLG may be formed. The input/output contact plug IOPLG may penetrate the first interlayer insulating layer, the planarization insulating layer 120, the first and second gap-fill insulating patterns 110 and 115, and a portion of the lower insulating layer 50, in the second connection region CNR2.

The second interlayer insulating layer 140, the bit line contact plugs BCT, and the connection contact plugs LCTa and LCTb may be formed on the first interlayer insulating layer 130.

The bit line contact plugs BCT may be formed to penetrate the first and second interlayer insulating layers 130 and 140 and may be connected to the vertical structures VS.

The first connection contact plugs LCTa may be formed to penetrate the second interlayer insulating layer 140 and may be connected to the cell contact plugs CPLG. The second connection contact plugs LCTb may be formed to penetrate the second interlayer insulating layer 140 and may be connected to the peripheral contact plugs PPLG and the input/output contact plug IOPLG.

The bit lines BL and the lower interconnection lines LCLa and LCLb may be formed on the second interlayer insulating layer 140. The bit lines BL may be connected to the bit line contact plugs BCT, and the lower interconnection lines LCLa and LCLb may be connected to the connection contact plugs LCTa and LCTb.

The third, fourth, and fifth interlayer insulating layers 150, 160, and 170 may be stacked on the second interlayer insulating layer 140, and the first and second upper conductive lines UCLa and UCLb may be formed in the fourth interlayer insulating layer 160. The first and second upper conductive lines UCLa and UCLb may be connected to the first and second lower conductive lines LCLa and LCLb. The first bonding pads BP1 may be formed in the fifth interlayer insulating layer 170 and may be connected to the first and second upper conductive lines UCLa and UCLb. The first and second upper conductive lines UCLa and UCLb and the first bonding pads BP1 may be formed using a damascene process.

Figure 20:
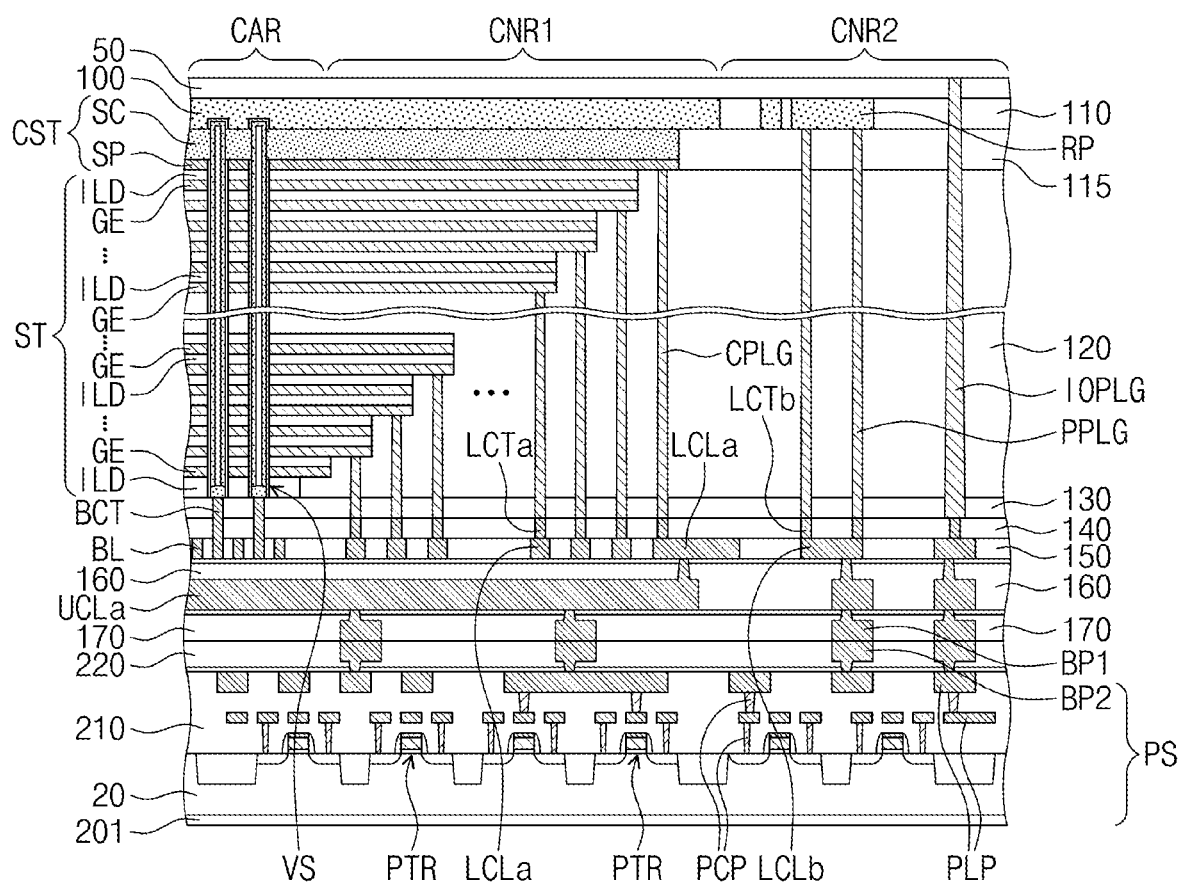

Referring to FIG. 20, the second semiconductor substrate 20, on which a peripheral circuit structure including the second bonding pads BP2 is formed, may be prepared, and then, the first bonding pads BP1 of the first semiconductor substrate 10 may be bonded to the second bonding pads BP2 of the second semiconductor substrate 20.

Accordingly, the first bonding pads BP1 and the second bonding pads BP2 may be bonded to each other, and in this case, the uppermost layer (e.g., the interlayer insulating layer 170) on the first semiconductor substrate 10 and the uppermost layer (e.g., the peripheral interlayer insulating layer 220) on the second semiconductor substrate 20 may be bonded to each other.

After the bonding of the first and second bonding pads BP1 and BP2, the first semiconductor substrate 10 may be removed. The removal of the first semiconductor substrate 10 may be performed using a grinding and planarization process. As a result of the removal of the first semiconductor substrate 10, the bottom surface of the lower insulating layer 50 may be exposed, and in an embodiment, a portion of the lower insulating layer 50 may be etched to expose the input/output contact plug IOPLG.

Thereafter, referring back to FIG. 6A, the capping insulating layer 310 may be formed on the bottom surface of the lower insulating layer 50, and the input/output pads PAD may be formed on the capping insulating layer 310. The input/output pad PAD may be connected to the input/output contact plug IOPLG through a contact plug penetrating the capping insulating layer 310.

After the formation of the input/output pads PAD, the capping insulating layer 310 may be formed on the bottom surface of the lower insulating layer 50. The capping insulating layer 310 may include a silicon oxide layer, a silicon nitride layer, or a silicon oxynitride layer.

The protection layer 320 and 330 and the passivation layer 340 may be sequentially formed on the capping insulating layer 310. The protection layer 320 and 330 may be, for example, a silicon nitride layer or a silicon oxynitride layer. The passivation layer 340 may be formed of or include a polyimide-based material (e.g., photo-sensitive polyimide (PSPI)). The passivation layer 340 may be formed on the protection layer 320 and 330 by a spin coating process.

Next, the opening OP exposing a portion of the input/output pad PAD may be formed by patterning the protection layer 320 and 330 and the passivation layer 340.

According to an embodiment of the inventive concept, a resistor pattern may be formed, along with a semiconductor layer of a cell array structure. Thus, it may be possible to secure an area for peripheral circuits, even when the number of electrodes in a stack is increased and the number of transistors in a peripheral circuit structure is increased. This may make it possible to increase an integration density of a semiconductor device.

While example embodiments of the inventive concept have been particularly shown and described, it will be understood by one of ordinary skill in the art that variations in form and detail may be made therein without departing from the scope of the attached claims.

What is claimed is:

1. A semiconductor device comprising:
   a peripheral circuit structure including peripheral circuits that are on a semiconductor substrate, and first bonding pads that are electrically connected to the peripheral circuits; and
   a cell array structure including a memory cell array including memory cells that are three-dimensionally arranged on a semiconductor layer, and second bonding pads that are electrically connected to the memory cell array and are coupled to the first bonding pads,
   wherein the cell array structure comprises:
   a resistor pattern positioned at the same level as the semiconductor layer;
   a stack including insulating layers and electrodes that are vertically and alternately stacked on the semiconductor layer; and
   vertical structures penetrating the stack.

2. The semiconductor device of claim 1,
   wherein the resistor pattern comprises the same material as the semiconductor layer, and
   wherein a thickness of the resistor pattern is substantially equal to a thickness of the semiconductor layer.

3. The semiconductor device of claim 1, further comprising a plate metal layer that is in contact with a surface of the semiconductor layer,
   wherein the resistor pattern comprises:
   an upper resistor pattern that includes the same semiconductor material as the semiconductor layer; and
   a lower resistor pattern that includes the same metallic material as the plate metal layer.

4. The semiconductor device of claim 1, further comprising an input/output pad that is on an insulating layer and is electrically connected to the peripheral circuits and the memory cell array,
   wherein the insulating layer covers a surface of the semiconductor layer.

5. The semiconductor device of claim 4,
   wherein the cell array structure comprises a cell array region, a first connection region, and a second connection region, and
   wherein the cell array structure further comprises:
   cell contact plugs that are coupled to end portions of the electrodes, respectively, in the first connection region;
   a peripheral contact plug that is electrically connected to the resistor pattern in the second connection region; and
   an input/output contact plug that is electrically connected to the input/output pad in the second connection region.

6. The semiconductor device of claim 1,
   wherein the cell array structure further comprises conductive lines that cross the stack and are electrically connected to the vertical structures,
   wherein the peripheral circuit structure comprises a first peripheral circuit structure that is adjacent to the conductive lines of the cell array structure and includes first peripheral circuits, and a second peripheral circuit structure that is adjacent to the semiconductor layer of the cell array structure and includes second peripheral circuits,
   wherein the first bonding pads are electrically connected to the first peripheral circuit structure, and
   wherein the semiconductor device further comprises third bonding pads that are electrically connected to the second peripheral circuit structure.

7. The semiconductor device of claim 6,
   wherein the second bonding pads are adjacent to the first peripheral circuit structure,
   wherein the semiconductor device further comprises fourth bonding pads that are adjacent to the second peripheral circuit structure, and
   wherein at least one of the second bonding pads or the fourth bonding pads is electrically connected to the resistor pattern.

8. The semiconductor device of claim 6, further comprising an input/output pad that is on an insulating layer covering a surface of the second peripheral circuit structure and is electrically connected to the peripheral circuits and the memory cell array,
   wherein the second peripheral circuit structure is between the input/output pad and the insulating layer.

9. The semiconductor device of claim 8, further comprising an input/output contact plug that penetrates a portion of the second peripheral circuit structure and a portion of the cell array structure and electrically connects the first peripheral circuit structure to the input/output pad.

10. The semiconductor device of claim 1,
wherein the cell array structure further comprises a source structure between the semiconductor layer and the stack, and
wherein the resistor pattern is positioned at a level different from the source structure.

11. The semiconductor device of claim 1,
wherein the cell array structure further comprises:
a source semiconductor pattern between the semiconductor layer and the stack; and
a support semiconductor pattern between the source semiconductor pattern and the stack, and
wherein a surface of the resistor pattern that faces the peripheral circuit structure is at a first level equal to that of a surface of the source semiconductor pattern that faces the semiconductor layer, or a second level that is farther than the surface of the source semiconductor pattern from the support semiconductor pattern.

12. The semiconductor device of claim 11, wherein each of the vertical structures comprises:
a vertical semiconductor pattern having a side surface that is in contact with the source semiconductor pattern; and
a data storage pattern that is between the vertical semiconductor pattern and the stack.

13. A semiconductor device comprising:
a peripheral circuit structure including peripheral circuits on a semiconductor substrate and peripheral circuit interconnection lines electrically connected to the peripheral circuits;
a semiconductor layer on the peripheral circuit structure;
a resistor pattern that is on the peripheral circuit structure and is horizontally spaced apart from the semiconductor layer;
a stack including insulating layers and electrodes that are vertically and alternately stacked on the semiconductor layer; and
a source structure between the semiconductor layer and the stack, the source structure comprising a source semiconductor pattern and a support semiconductor pattern that are sequentially stacked on the semiconductor layer,
wherein the resistor pattern comprises the same material as the semiconductor layer, and
wherein a level of a surface of the resistor pattern that faces the peripheral circuit structure is equal to that of a surface of the semiconductor layer that faces the source semiconductor pattern, or the level of the surface of the resistor pattern is farther than the surface of the semiconductor layer from the support semiconductor pattern.

14. The semiconductor device of claim 13,
wherein the semiconductor substrate comprises a cell array region, a first connection region, and a second connection region,
wherein the stack is on the cell array region and the first connection region and has a staircase structure on the first connection region, and
wherein the resistor pattern is on the second connection region.

15. The semiconductor device of claim 14, further comprising:
a planarization insulating layer on the stack; and
peripheral contact plugs that are on the second connection region and that penetrate the planarization insulating layer and are electrically connected to the resistor pattern.

16. The semiconductor device of claim 13, wherein each of the source semiconductor pattern and the support semiconductor pattern comprises a doped poly-silicon layer.

17. The semiconductor device of claim 13, further comprising vertical structures penetrating the stack and the source structure,
wherein each of the vertical structures comprises a vertical semiconductor pattern having a side surface that is in contact with the source semiconductor pattern.

18. An electronic system comprising:
a semiconductor device comprising a peripheral circuit structure including peripheral circuits on a semiconductor substrate and peripheral circuit interconnection lines electrically connected to the peripheral circuits, a cell array structure on the peripheral circuit structure, and an input/output pad electrically connected to the peripheral circuits; and
a controller that is electrically connected to the semiconductor device through the input/output pad and is configured to control the semiconductor device,
wherein the cell array structure comprises:
a semiconductor layer;
a resistor pattern that is on the peripheral circuit structure and is horizontally spaced apart from the semiconductor layer, the resistor pattern comprising the same material as the semiconductor layer and having a thickness that is smaller than or equal to that of the semiconductor layer; and
a stack including insulating layers and electrodes that are vertically and alternately stacked on the semiconductor layer.

19. The electronic system of claim 18,
wherein the peripheral circuit structure comprises first bonding pads electrically connected to the peripheral circuits, and
wherein the cell array structure comprises second bonding pads bonded to the first bonding pads.

20. The electronic system of claim 18,
wherein the cell array structure further comprises:
a source semiconductor pattern between the semiconductor layer and the stack;
a support semiconductor pattern between the source semiconductor pattern and the stack; and
vertical structures penetrating the stack, the support semiconductor pattern, and the source semiconductor pattern, and
wherein a level of a surface of the resistor pattern that faces the peripheral circuit structure is equal that of a surface of the source semiconductor pattern that faces the semiconductor layer, or the level of the surface of the resistor pattern is farther than the surface of the source semiconductor pattern from the support semiconductor pattern.

* * * * *